(12) United States Patent
Machida

(10) Patent No.: US 8,744,614 B2
(45) Date of Patent: Jun. 3, 2014

(54) SUBSTRATE PROCESSING APPARATUS, AND SUBSTRATE TRANSPORT METHOD

(75) Inventor: Eisaku Machida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 395 days.

(21) Appl. No.: 13/183,077

(22) Filed: Jul. 14, 2011

(65) Prior Publication Data

US 2012/0016516 A1  Jan. 19, 2012

(30) Foreign Application Priority Data

Jul. 14, 2010  (JP) ................................. 2010-159708

(51) Int. Cl.
*G06F 17/00*  (2006.01)

(52) U.S. Cl.
USPC ............... 700/218; 700/112; 134/61; 134/15; 414/222.01; 29/25.01

(58) Field of Classification Search
USPC ........................................................ 700/218
See application file for complete search history.

(56) References Cited

U.S. PATENT DOCUMENTS

| 7,628,824 | B2 * | 12/2009 | Machida ...................... 29/25.01 |
| 2006/0137726 | A1 * | 6/2006 | Sano et al. ...................... 134/61 |
| 2008/0156351 | A1 * | 7/2008 | Mitsuyoshi et al. ............. 134/15 |
| 2008/0199283 | A1 | 8/2008 | Mitsuyoshi .............. 414/222.01 |
| 2008/0235926 | A1 | 10/2008 | Machida |
| 2009/0070946 | A1 | 3/2009 | Tamada et al. ................. 15/21.1 |
| 2009/0252578 | A1 * | 10/2009 | Machida ................... 414/222.01 |
| 2012/0016516 | A1 * | 1/2012 | Machida ....................... 700/218 |
| 2012/0143366 | A1 * | 6/2012 | Machida ....................... 700/112 |

FOREIGN PATENT DOCUMENTS

| JP | 2008-198884 | 8/2008 |
| JP | 2009-032712 | 2/2009 |
| JP | 2009-71235 | 4/2009 |
| JP | 10-2009-0105806 | 10/2009 |
| JP | 2009-260252 | 11/2009 |
| JP | 2010-045214 | 2/2010 |
| KR | 10-0957816 | 8/2009 |

* cited by examiner

*Primary Examiner* — Ramya Burgess
*Assistant Examiner* — Kyle Logan
(74) *Attorney, Agent, or Firm* — Ostrolenk Faber LLP

(57) ABSTRACT

By a first transport robot, n substrates are unloaded from a first retaining portion, then simultaneously transported, and respectively loaded into n substrate holders consecutively arranged from one side defined with respect to an arrangement direction. Thereafter, a rotation mechanism rotates n+m substrate holders so as to perform a substrate inverting operation and so as to arrange the n+m substrate holders along the arrangement direction in an arrangement sequence reverse to a pre-rotation arrangement sequence. Thereafter, the n substrates loaded into the n substrate holders are unloaded in a group of m in a sequence from the one side, and loaded into a second retaining unit by a second transport robot. After the substrate inverting operation, n substrates are unloaded from the first retaining unit, and loaded again into n substrate holders consecutively arranged from the one side by the first transport robot.

16 Claims, 7 Drawing Sheets

SUBSTRATE PROCESSING APPARATUS, AND SUBSTRATE TRANSPORT METHOD

BACKGROUND OF THE INVENTION

1. Field of the Invention

The present invention relates to a substrate processing apparatus for processing a substrate, and to a substrate transport method to be implemented by the substrate processing apparatus. Examples of the substrate to be processed and transported include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, and substrates for solar cells.

2. Description of Related Art

In production processes for semiconductor devices and liquid crystal display devices, substrates such as semiconductor wafers and glass substrates for the liquid crystal display devices are treated with treatment liquids. A substrate processing apparatus of a single substrate processing type adapted to process a single substrate at a time is disclosed, for example, in U.S. Patent Application Publication No. 2009/0252578 A1.

The substrate processing apparatus includes a carrier retaining unit which retains a plurality of carriers, substrate processing units which each process a substrate, two inversion units vertically stacked between the carrier retaining unit and the substrate processing units, an indexer robot which transports a substrate between the inversion units and the carrier retaining unit, and a main transport robot which transports a substrate between the inversion units and the substrate processing units. The inversion units are each capable of horizontally holding a substrate and rotating the substrate 180 degrees about a horizontal axis (rotation axis) to invert the substrate. The indexer robot and the main transport robot can access the respective inversion units.

The inversion units each include a plurality of substrate holders which each horizontally hold a substrate. Where the number of substrates to be simultaneously transported by the indexer robot differs from the number of substrates to be simultaneously transported by the main transport robot, the number of the substrate holders to be provided in each of the inversion units is twice a greater one of these substrate numbers. Where the number of the substrates to be simultaneously transported by the indexer robot is equal to the number of the substrates to be simultaneously transported by the main transport robot, the number of the substrate holders to be provided in each of the inversion units is twice the number of the substrates to be simultaneously transported by each of the transport robots (the indexer robot and the main transport robot). Where the transport robots are each adapted to transport a single substrate at a time, for example, two substrate holders are provided in each of the inversion units. Further, the substrate holders provided in each of the inversion units are disposed symmetrically on opposite sides of the rotation axis. Where two substrate holders are provided, for example, the two substrate holders are disposed symmetrically on upper and lower sides of the rotation axis.

Where two substrate holders are provided in each of the inversion units, the following operation sequence is repeatedly performed to individually transport substrates from the carrier retaining unit to the substrate processing units while a substrate inverting operation is performed by one of the inversion units. More specifically, the indexer robot unloads a substrate from one of the carriers, and loads the substrate into an upper one of the substrate holders of the one inversion unit. Thereafter, the one inversion unit rotates the two substrate holders 180 degrees about the rotation axis. Thus, the upper substrate holder which retains the loaded substrate is moved down below the rotation axis, and the (empty) lower substrate holder which retains no substrate is moved up above the rotation axis. The main transport robot unloads the substrate inverted by the one inversion unit from the lower substrate holder of the one inversion unit.

Similarly, where two substrate holders are provided in each of the inversion units, the following operation sequence is repeatedly performed to individually transport substrates from the substrate processing units to the carrier retaining unit while the substrate inverting operation is performed by the other inversion unit. More specifically, the main transport robot unloads a substrate from one of the substrate processing units, and loads the substrate into an upper one of the substrate holders of the other inversion unit. Thereafter, the other inversion unit rotates the two substrate holders 180 degrees about the rotation axis. Thus, the upper substrate holder which retains the loaded substrate is moved down below the rotation axis, and the (empty) lower substrate holder which retains no substrate is moved up above the rotation axis. The indexer robot unloads the substrate inverted by the other inversion unit from the lower substrate holder of the other inversion unit.

SUMMARY OF THE INVENTION

It is desirable to increase the throughput of the substrate processing apparatus (the number of substrates processed per unit time). To increase the throughput, it is conceivable to reduce a substrate transport period. The substrate transport period is reduced, for example, by reducing standby periods of the indexer robot and the main transport robot.

If the substrates are transported from the carrier into the substrate processing units via the one inversion unit as in the conventional substrate processing apparatus described above, the indexer robot can load the next substrate into the one inversion unit before the main transport robot unloads the substrate from the one inversion unit. Thus, the standby period of the indexer robot can be reduced.

Similarly, if the substrates are transported from the substrate processing units into the carrier via the other inversion unit as described above, the main transport robot can load the next substrate into the other inversion unit before the indexer robot unloads the substrate from the other inversion unit. Thus, the standby period of the main transport robot can be reduced.

In the conventional substrate processing apparatus described above, however, the number of the substrate holders provided in each of the inversion units is twice the number of the substrates to be simultaneously transported by each of the transport robots. Therefore, the size of the inversion units is increased, as the number of the substrates to be simultaneously transported by each of the transport robots increases. Since the inversion units are each provided in a very limited space within the substrate processing apparatus, the inversion units desirably each have a smaller size.

It is therefore an object of the present invention to reduce the standby periods of the transport robots and to suppress or prevent the size increase of the substrate processing apparatus.

According to one embodiment of the present invention, there is provided a substrate processing apparatus, which includes a first retaining unit, a second retaining unit, n+m substrate holders (wherein n is an integer not smaller than 2 and m is a positive integer that is smaller than n and a divisor of n), a rotation mechanism, a first transport robot, a second transport robot, and a control unit. The first retaining unit retains substrates. Similarly, the second retaining unit retains substrates. Each of the n+m substrate holders is capable of retaining a substrate. The n+m substrate holders are capable of retaining substrates in state where the substrate are arranged along a predetermined arrangement direction. Further, the n+m substrate holders are unitarily rotatable for a substrate inverting operation. The rotation mechanism rotates the n+m substrate holders so as to perform the substrate inverting operation and so as to arrange the n+m substrate holders along the arrangement direction in a post-rotation arrangement sequence reverse to a pre-rotation arrangement sequence in which the n+m substrate holders are arranged before rotation. The first transport robot transports a substrate. Similarly, the second transport robot transports a substrate.

The control unit performs: a first loading step of controlling the first transport robot so that n substrates are unloaded from the first retaining unit, then simultaneously transported and respectively loaded into n of the substrate holders consecutively arranged from one of opposite sides defined with respect to the arrangement direction by the first transport robot; an inverting step of controlling the rotation mechanism after the first loading step to rotate the n+m substrate holders so as to perform the substrate inverting operation and so as to arrange the n+m substrate holders along the arrangement direction in the post-rotation arrangement sequence reverse to the pre-rotation arrangement sequence; an unloading step of controlling the second transport robot after the inverting step so that the n substrates loaded into the n substrate holders in the first loading step are unloaded in a group of m in a sequence from the one side defined with respect to the arrangement direction and loaded into the second retaining unit by the second transport robot; and a second loading step of controlling the first transport robot after the inverting step so that n substrates are unloaded from the first retaining unit, then simultaneously transported and loaded into n of the substrate holders consecutively arranged from the one side defined with respect to the arrangement direction by the first transport robot.

With this arrangement, a plurality of substrates is transported between the first retaining unit and the second retaining unit via the substrate holders. More specifically, the substrates are transported from the first retaining unit to the substrate holders by the first transport robot. Then, the substrates transported to the substrate holders are transported to the second retaining unit by the second transport robot. On the other hand, the substrates are transported from the second retaining unit to the substrate holders by the second transport robot. Then, the substrates transported to the substrate holders are transported to the first retaining unit by the first transport robot.

The control unit causes the first transport robot to unload the n substrates from the first retaining unit. The control unit causes the second transport robot to unload m of the n substrates from m of the substrate holders, respectively. Here, n is an integer not smaller than 2, and m is a positive integer that is smaller than n and a divisor of n. The number of the substrate holders is n+m. The n+m substrate holders are arranged along the predetermined arrangement direction. Therefore, the n+m substrate holders are capable of retaining substrates, which are arranged along the arrangement direction. Further, the n+m substrate holders are unitarily rotatable for the substrate inverting operation. The rotation mechanism rotates the n+m substrate holders so as to arrange the n+m substrate holders along the arrangement direction in the post-rotation arrangement sequence reverse to the pre-rotation arrangement sequence. Thus, the substrates retained in any of the n+m substrate holders are inverted.

The control unit controls the first transport robot in the following manner to transport a plurality of substrates between the first retaining unit and the second retaining unit while performing the substrate inverting operation.

The control unit controls the first transport robot so that the n substrates are unloaded from the first retaining unit, then simultaneously transported and loaded into the n substrate holders consecutively arranged from the one side defined with respect to the arrangement direction by the first transport robot (first loading step). After the first loading step, the n substrate holders consecutively arranged from the one side defined with respect to the arrangement direction respectively retain the n substrates loaded therein, and the other m substrate holders retain no substrates.

After the first loading step, the control unit controls the rotation mechanism to cause the rotation mechanism to rotate the n+m substrate holders so as to perform the substrate inverting operation (inverting step) and so as to arrange the n+m substrate holders along the arrangement direction in the post-rotation arrangement sequence reverse to the pre-rotation arrangement sequence. After the inverting step, the n substrate holders consecutively arranged from the one side defined with respect to the arrangement direction are moved to the other side defined with respect to the arrangement direction. After the inverting step, therefore, m of the substrate holders consecutively arranged from the one side defined with respect to the arrangement direction retain no substrates, and the other n substrate holders retain the substrates loaded therein.

After the inverting step, the control unit controls the second transport robot so that the n substrates respectively loaded into the n substrate holders in the first loading step are unloaded in a group of m in a sequence from the one side defined with respect to the arrangement direction and loaded into the second retaining unit by the second transport robot (unloading step). That is, after the inverting step, n substrate holders consecutively arranged from the other side defined with respect to the arrangement direction respectively retain the n substrates loaded therein. The control unit causes the second transport robot to unload m of the n substrates consecutively arranged from the one side defined with respect to the arrangement direction. Thereafter, the control unit causes the second transport robot to unload m of the other (n−m) substrates consecutively arranged from the one side defined with respect to the arrangement direction. Thus, the control unit causes the second transport robot to repeatedly perform an m-substrate unloading operation. Since m is a positive integer smaller than n and a divisor of n, the n substrates are unloaded from the n substrate holders, respectively.

On the other hand, the control unit controls the first transport robot after the inverting step so that n substrates are unloaded from the first retaining unit, then simultaneously transported and loaded into n of the substrate holders consecutively arranged from the one side defined with respect to the arrangement direction by the first transport robot (second loading step). Before the second transport robot performs the substrate unloading operation after the inverting step, m of the substrate holders consecutively arranged from the one side defined with respect to the arrangement direction retain no substrates, and the other n substrate holders respectively retain the n substrates loaded therein. That is, some of n substrate holders consecutively arranged from the one side defined with respect to the arrangement direction retain substrates loaded therein, so that the control unit causes the second transport robot to perform the m-substrate unloading operation once or a plurality of times to empty the n substrate holders consecutively arranged from the one side defined with respect to the arrangement direction before the first transport robot loads the n substrates again.

It is specifically assumed that n=2 and m=1. In this case, n+m=3, so that three substrate holders are provided. In the first loading step, therefore, two (n) substrates are respectively loaded into two (n) of the substrate holders consecutively arranged from the one side defined with respect to the arrangement direction. Before the second transport robot performs the substrate unloading operation after the inverting step, one (m) of the substrate holders located on the one side defined with respect to the arrangement direction retains no substrate, and the other two (n) substrate holders respectively retain the substrates. After the second transport robot first unloads a single substrate (m substrates), two (m+m=2m) substrate holders consecutively arranged from the one side with respect to the arrangement direction retain no substrates, and the other one (n−m) substrate holder retains a substrate loaded therein. Before all the substrates (n substrates) previously loaded by the first transport robot are unloaded, the two (n) substrate holders consecutively arranged from the one side defined with respect to the arrangement direction are emptied. Therefore, after the second transport robot performs the single-substrate unloading operation (m-substrate unloading operation) once, the control unit causes the first transport robot to respectively load two (n) substrates into the two (n) substrate holders consecutively arranged from the one side defined with respect to the arrangement direction (second loading step).

Next, it is assumed that n=3 and m=1. In this case, one (m) of the substrate holders located on the one side defined with respect to the arrangement direction retains no substrate, and the other three (n) substrate holders respectively retain substrates loaded therein, before the second transport robot performs the substrate unloading operation after the inverting step. The three (n) substrates respectively retained in these three (n) substrate holders are unloaded one by one (in a group of m) in a sequence from the one side defined with respect to the arrangement direction by the second transport robot. After the second transport robot performs the single substrate unloading operation (m-substrate unloading operation) twice, three (m+2 m=3m) substrate holders consecutively arranged from the one side defined with respect to the arrangement direction retain no substrates, and the other one (n−2m) substrate holder retains a substrate loaded therein. Before all the substrates (n substrates) previously loaded by the first transport robot are unloaded, the three (n) substrate holders consecutively arranged from the one side defined with respect to the arrangement direction are emptied. Therefore, after the second transport robot performs the single-substrate unloading operation (m-substrate unloading operation) twice, the control unit causes the first transport robot to respectively load three (n) substrates into the three (n) substrate holders consecutively arranged from the one side defined with respect to the arrangement direction (second loading step).

Thus, the control unit empties the n substrate holders consecutively arranged from the one side defined with respect to the arrangement direction before all the substrates previously loaded by the first transport robot are unloaded. Therefore, the control unit can cause the first transport robot to load the n substrates again into the n substrate holders consecutively arranged from the one side defined with respect to the arrangement direction before all the substrates previously loaded by the first transport robot are unloaded. Therefore, the control unit does not have to keep the first transport robot in standby until all the substrates previously loaded by the first transport robot are unloaded. This reduces the standby period of the first transport robot. The number of the substrate holders is n+m (wherein m is a positive integer smaller than n), which is smaller in number than twice the number (n) of the substrates to be simultaneously transported by the first transport robot (2n). This suppresses or prevents the size increase of the substrate processing apparatus as compared with the case in which the number of the substrate holders is twice the number of the substrates to be simultaneously transported by the first transport robot.

In the embodiment of the present invention, the control unit may perform the second loading step concurrently with the unloading step.

In this case, the substrate loading operation performed by the first transport robot is concurrent with the substrate unloading operation performed by the second transport robot. Thus, the substrate transport period can be reduced as compared with the case in which the first transport robot performs the substrate loading operation after the second transport robot unloads all the substrates previously loaded by the first transport robot. This increases the throughput of the substrate processing apparatus.

In the embodiment of the present invention, the control unit may cause the first transport robot to separately load the n substrates into the n substrate holders, respectively, at different times in at least one of the first loading step and the second loading step, or simultaneously load the n substrates into the n substrate holders, respectively, in at least one of the first loading step and the second loading step. The simultaneous loading of the n substrates allows for reduction of the substrate loading period.

In the embodiment of the present invention, n may have a value that is equal to m multiplied by 2.

Before the second transport robot performs the substrate unloading operation (before the unloading step) after the inversion step, the m substrate holders consecutively arranged from the one side defined with respect to the arrangement direction retain no substrates, and the other n substrate holders respectively retain substrates loaded therein. In the unloading step, the n substrates respectively retained in the n substrate holders are unloaded in a group of m in a sequence from the one side defined with respect to the arrangement direction by the second transport robot. Therefore, m+m substrate holders consecutively arranged from the one side defined with respect to the arrangement direction are emptied when the second transport robot performs the substrate unloading operation once. Since m+m=2×m=n, the n substrate holders consecutively arranged from the one side defined with respect to the arrangement direction are emptied when the second transport robot performs the m-substrate unloading operation once. Thus, the control unit can start the second loading step to cause the first transport robot to perform the substrate loading operation after the second transport robot performs the m-substrate unloading operation once. That is, the control unit does not have to keep the first transport robot in standby until the second transport robot performs the m-substrate unloading operation a plurality of times. This reduces the standby period of the first transport robot.

In the embodiment of the present invention, the first retaining unit may include a container retaining unit which retains a plurality of containers each capable of containing a plurality of substrates. The second retaining unit may include a substrate processing unit which retains a substrate and processes the retained substrate. The substrate processing apparatus may further include a movement mechanism which moves the first transport robot. The control unit controls the movement mechanism to move the first transport robot between the containers and the substrate holders.

In this case, the substrates are transported between the container retaining unit and the substrate processing unit via the substrate holders. More specifically, the substrates contained in the containers retained by the container retaining unit are transported to the substrate holders by the first transport robot. Then, the substrates transported to the substrate holders are each further transported to the substrate processing unit by the second transport robot. Thus, the substrates are each processed. The substrates each processed by the substrate processing unit are transported to the substrate holders by the second transport robot. Then, the substrates transported to the substrate holders are further transported to the containers retained by the container retaining unit by the first transport robot.

The control unit controls the movement mechanism to move the first transport robot between the containers and the substrate holders. Therefore, the first transport robot has a wider substrate transport range than the second transport robot. Accordingly, the first transport robot is heavier in transport duty than the second transport robot. Therefore, the standby period of the first transport robot is reduced to substantially prevent the first transport robot from limiting the processing rate of the substrate processing apparatus.

In the embodiment of the present invention, the substrate processing apparatus may further include a substrate transfer unit which retains a substrate. The control unit may be configured to perform a transporting step of transporting a substrate between the first retaining unit and the second retaining unit with a front surface of the substrate facing in a predetermined direction. The transporting step to be performed by the control unit may include a first transporting step of causing the first transport robot to transport the substrate between the first retaining unit and the substrate transfer unit with the front surface of the substrate facing in the predetermined direction, and a second transporting step of causing the second transport robot to transport the substrate between the second retaining unit and the substrate transfer unit with the front surface of the substrate facing in the predetermined direction. The substrate transfer unit may be the substrate holders, or may be a unit different from the substrate holders. The substrate transfer unit may include the substrate holders.

In this case, the first transport robot transports the substrate between the first retaining unit and the substrate transfer unit with the front surface of the substrate facing in the predetermined direction (first transporting step). Further, the second transport robot transports the substrate between the second retaining unit and the substrate transfer unit with the front surface of the substrate facing in the predetermined direction (second transporting step). Therefore, the control unit performs the first transporting step to cause the first transport robot to transport the substrate from the first retaining unit to the substrate transfer unit. Further, the control unit performs the second transporting step to cause the second transport robot to transport the substrate from the substrate transfer unit to the second retaining unit. Therefore, the control unit can transport the substrate from the first retaining unit to the second retaining unit with the front surface of the substrate facing in the predetermined direction (transporting step). Further, the control unit can perform the first transporting step after the second transporting step to transport the substrate from the second retaining unit to the first retaining unit with the front surface of the substrate facing in the predetermined direction (transporting step). Thus, the substrate processing apparatus according to the embodiment of the present invention is capable of transporting the substrate between the first retaining unit and the second retaining unit without inverting the substrate.

In the embodiment of the present invention, the first transport robot may include a first hand movable along the arrangement direction, and a first hand movement mechanism which moves the first hand along the arrangement direction. The second transport robot may include a second hand movable along the arrangement direction, and a second hand movement mechanism which moves the second hand along the arrangement direction. The control unit may be configured to cause the first hand movement mechanism to move the first hand into opposed relation to the n+m substrate holders in at least one of the first loading step and the second loading step. Further, the control unit may be configured to cause the second hand movement mechanism to move the second hand into opposed relation to the n+m substrate holders in the unloading step.

In this case, the control unit controls the first hand movement mechanism to move the first hand along the arrangement direction into opposed relation to any of the substrate holders. Similarly, the control unit controls the second hand movement mechanism to move the second hand along the arrangement direction into opposed relation to any of the substrate holders. In the embodiment of the present invention, as described above, the number of the substrate holders can be reduced, thereby reducing a distance between substrate holders located on the opposite sides defined with respect to the arrangement direction. This makes it possible to reduce a first hand movement distance for which the first transport robot moves the first hand when the first transport robot loads the substrate into any of the substrate holders or unloads the substrate from any of the substrate holders. Similarly, it is possible to reduce a second hand movement distance for which the second transport robot moves the second hand. This reduces the substrate transport ranges of the first transport robot and the second transport robot, thereby reducing the substrate transport period.

In the embodiment of the present invention, at least one of the first transport robot and the second transport robot may be opposed to the n+m substrate holders in an opposing direction perpendicular to the arrangement direction. The n+m substrate holders may be rotatable about a rotation axis perpendicular to the arrangement direction and the opposing direction. The control unit may be configured to rotate the n+m substrate holders 180 degrees about the rotation axis in the inverting step.

In this case, one of the substrate holders located on the one side defined with respect to the arrangement direction becomes closer to the transport robot (the first transport robot or the second transport robot) opposed to the n+m substrate holders when the control unit causes the rotation mechanism to rotate the n+m substrate holders about the rotation axis. Therefore, the substrate holders should be spaced sufficient distances from the transport robots so as not to collide against the transport robots. As the number of the substrate holders increases, the total size of the n+m substrate holders as measured along the arrangement direction is increased. Therefore, the distances between the substrate holders and the transport robots should be increased with the increase in the number of the substrate holders. However, the increase in the distances between the substrate holders and the transport robots tends to increase the footprint (occupied area) of the substrate processing apparatus. As described above, the embodiment of the present invention reduces the number of the substrate holders, thereby substantially preventing the increase in the distances between the substrate holders and the transport robots. This suppresses or prevents the increase in the footprint of the substrate processing apparatus.

According to another embodiment of the present invention, there is provided a substrate transport method, which is implemented by a substrate processing apparatus including a first retaining unit, a second retaining unit, n+m substrate holders (wherein n is an integer not smaller than 2, and m is a positive integer that is smaller than n and a divisor of n), a rotation mechanism, a first transport robot, and a second transport robot. The first retaining unit retains substrates. Similarly, the second retaining unit retains substrates. The n+m substrate holders are capable of respectively retaining substrates, which are arranged along a predetermined arrangement direction. Further, the n+m substrate holders are unitarily rotatable for a substrate inverting operation. The rotation mechanism rotates the n+m substrate holders so as to perform the substrate inverting operation and so as to arrange the n+m substrate holders along the arrangement direction in a post-rotation arrangement sequence reverse to a pre-rotation arrangement sequence in which the n+m substrate holders are arranged before rotation. The first transport robot transports a substrate. Similarly, the second transport robot transports a substrate.

The substrate transport method includes: a first loading step of causing the first transport robot to unload n substrates from the first retaining unit, then simultaneously transport the n substrates, and respectively load the n substrates into n of the substrate holders consecutively arranged from one of opposite sides defined with respect to the arrangement direction; an inverting step of causing the rotation mechanism after the first loading step to rotate the n+m substrate holders so as to perform the substrate inverting operation and so as to arrange the n+m substrate holders along the arrangement direction in the post-rotation arrangement sequence reverse to the pre-rotation arrangement sequence; an unloading step of causing the second transport robot after the inverting step to perform an m-substrate unloading operation such that the n substrates loaded into the n substrate holders in the first loading step are unloaded in a group of m in a sequence from the one side defined with respect to the arrangement direction and loaded into the second retaining unit by the second transport robot; and a second loading step of causing the first transport robot after the inverting step to unload n substrates from the first retaining unit, then simultaneously transport the n substrates, and respectively load the n substrates into n of the substrate holders consecutively arranged from the one side defined with respect to the arrangement direction. This method provides the same effects as described above.

In the another embodiment of the present invention, the second loading step may be concurrent with the unloading step. This provides the same effects as described above.

In the another embodiment of the present invention, at least one of the first loading step and the second loading step may include the step of causing the first transport robot to simultaneously load the n substrates into the n substrate holders, respectively. This provides the same effects as described above.

In the another embodiment of the present invention, n may have a value that is equal to m multiplied by 2. This provides the same effects as described above.

In the another embodiment of the present invention, the first retaining unit may include a container retaining unit which retains a plurality of containers each capable of containing a plurality of substrates. The second retaining unit may include a substrate processing unit which retains a substrate and processes the retained substrate. The substrate processing apparatus may further include a movement mechanism which moves the first transport robot. The substrate transport method may further include the step of causing the movement mechanism to move the first transport robot between the containers and the substrate holders. This provides the same effects as described above.

In the another embodiment of the present invention, the substrate processing apparatus may further include a substrate transfer unit which retains a substrate. The substrate transport method may further include a transporting step of transporting a substrate between the first retaining unit and the second retaining unit with a front surface of the substrate facing in a predetermined direction. The transporting step may include a first transporting step of causing the first transport robot to transport the substrate between the first retaining unit and the substrate transfer unit with the front surface of the substrate facing in the predetermined direction, and a second transporting step of causing the second transport robot to transport the substrate between the second retaining unit and the substrate transfer unit with the front surface of the substrate facing in the predetermined direction. This provides the same effects as described above.

In the another embodiment of the present invention, the first transport robot may include a first hand movable along the arrangement direction, and a first hand movement mechanism which moves the first hand along the arrangement direction. The second transport robot may include a second hand movable along the arrangement direction, and a second hand movement mechanism which moves the second hand along the arrangement direction. At least one of the first loading step and the second loading step may include the step of causing the first hand movement mechanism to move the first hand into opposed relation to the n+m substrate holders. Further, the unloading step may include the step of causing the second hand movement mechanism to move the second hand into opposed relation to the n+m substrate holders. This provides the same effects as described above.

In the another embodiment of the present invention, at least one of the first transport robot and the second transport robot may be opposed to the n+m substrate holders in an opposing direction perpendicular to the arrangement direction. The n+m substrate holders may be rotatable about a rotation axis perpendicular to the arrangement direction and the opposing direction. The inverting step may include the step of causing the rotation mechanism to rotate the n+m substrate holders 180 degrees about the rotation axis. This provides the same effects as described above.

The foregoing and other objects, features and effects of the present invention will become more apparent from the following detailed description of the preferred embodiments with reference to the attached drawings.

DETAILED DESCRIPTION OF PREFERRED EMBODIMENTS

First Embodiment

Figure 1:
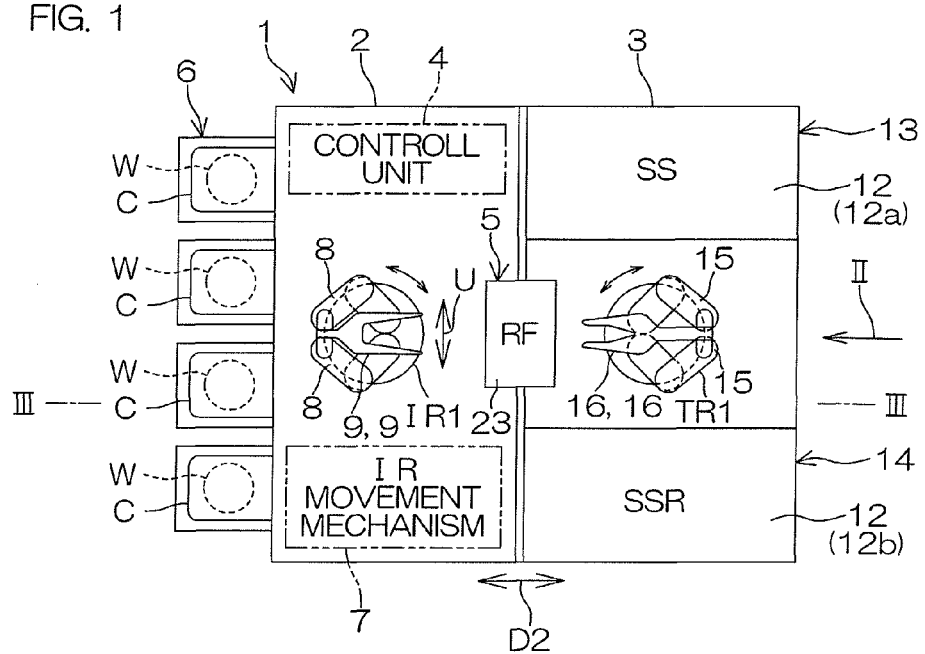
FIG. 1 is a plan view of a substrate processing apparatus according to a first embodiment of the present invention.
Figure 2:
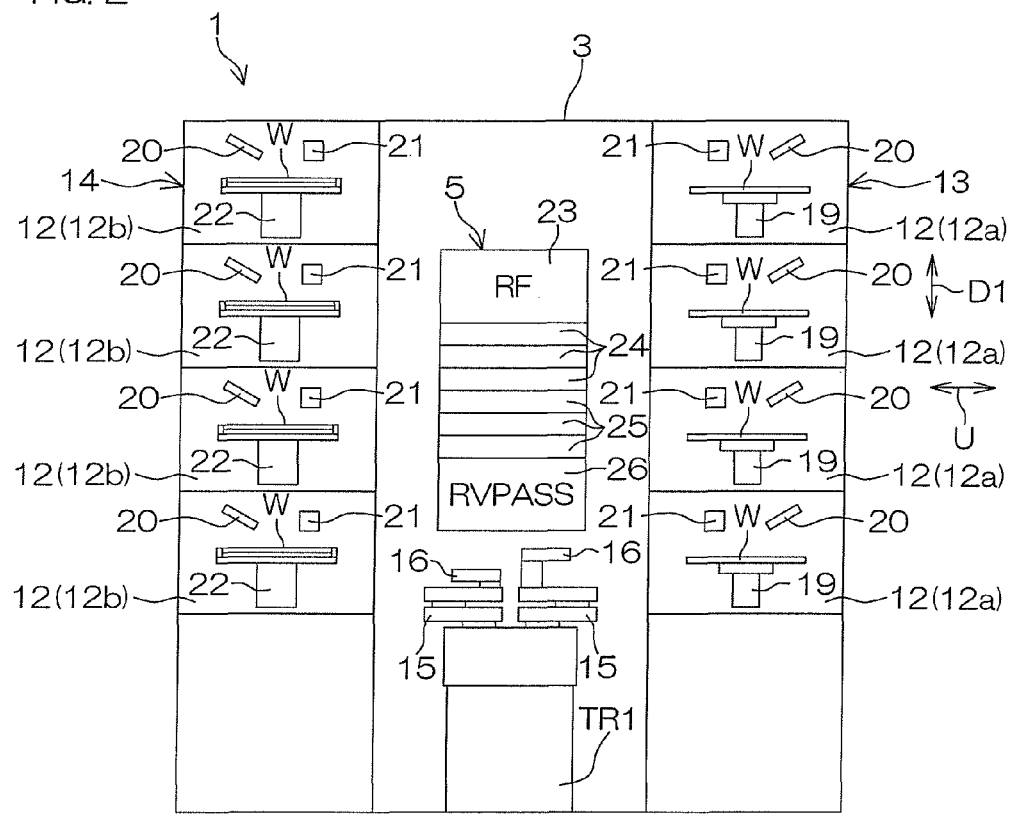
FIG. 2 is a diagram of the substrate processing apparatus according to the first embodiment of the present invention as seen in an arrow direction II in FIG. 1.
Figure 3:
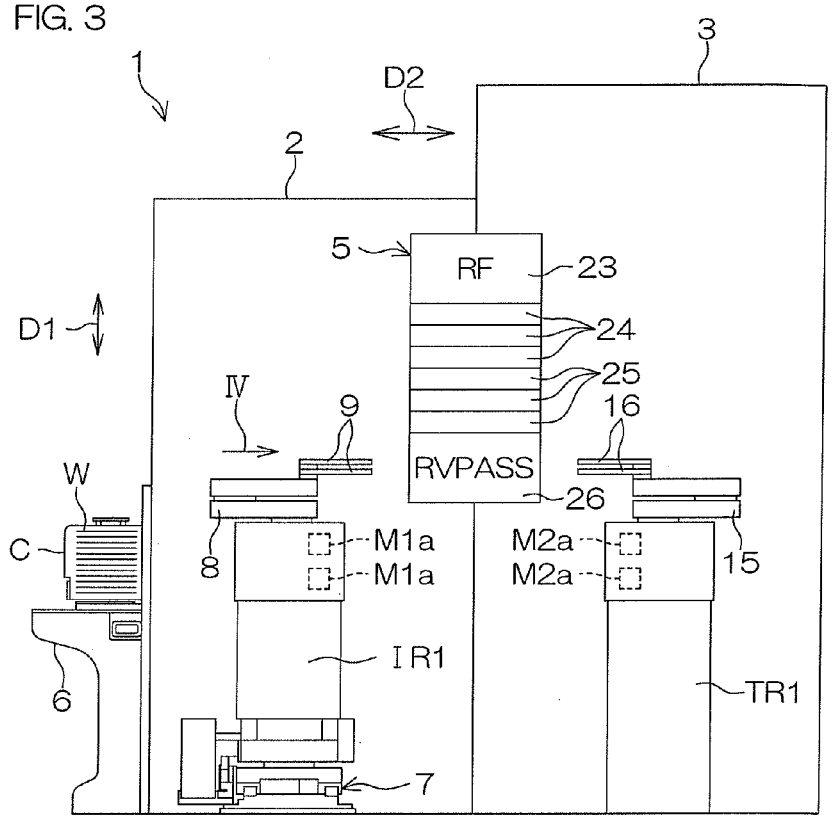
FIG. 3 is a schematic diagram of the substrate processing apparatus taken along a line III-III in FIG. 1.

FIG. 1 is a plan view of a substrate processing apparatus 1 according to a first embodiment of the present invention. FIG. 2 is a diagram of the substrate processing apparatus 1 according to the first embodiment of the present invention as seen in an arrow direction II in FIG. 1. FIG. 3 is a schematic diagram of the substrate processing apparatus 1 taken along a line III-III in FIG. 1.

The substrate processing apparatus 1 is of a single substrate processing type which is adapted to process a single substrate W (a semiconductor wafer or the like) at a time. As shown in FIG. 1, the substrate processing apparatus 1 includes an indexer block 2, a processing block 3 connected to the indexer block 2, and a control unit 4 which controls the substrate processing apparatus 1. A substrate transfer unit 5 is provided at a boundary between the indexer block 2 and the processing block 3.

The indexer block 2 includes a carrier retaining unit 6 (first retaining unit, container retaining unit), an indexer robot IR1 (first transport robot), and an IR movement mechanism 7 (movement mechanism). The carrier retaining unit 6 retains a plurality of carriers C (containers). The carriers C are retained by the carrier retaining unit 6 as being aligned in a horizontally extending carrier alignment direction U. The indexer robot IR1 is disposed between the carrier retaining unit 6 and the processing block 3. The IR movement mechanism 7 horizontally moves the indexer robot IR1 along the carrier alignment direction U. The IR movement mechanism 7 locates the indexer robot IR1 at any of positions at which the indexer robot IR1 is opposed to the respective carriers C and a position at which the indexer robot IR1 is opposed to the substrate transfer unit 5. The indexer robot IR1 transfers a substrate W between any of the carriers C and the substrate transfer unit 5. Further, the indexer robot IR1 performs a loading operation for loading a substrate W into any of the carriers C and the substrate transfer unit 5, and performs an unloading operation for unloading a substrate W from any of the carriers C and the substrate transfer unit 5.

As shown in FIG. 1, the indexer robot IR1 includes, for example, two arms 8, and two first hands 9. The indexer robot IR1 is capable of horizontally stretch the two arms 8 independently of each other. The first hands 9 are each provided at a distal end of the corresponding arm 8. The two first hands 9 are horizontally disposed and spaced from each other in a vertical direction D1 (in an arrangement direction) (in FIG. 1, the two first hands 9 are illustrated as vertically overlapping each other). The first hands 9 are each capable of holding a single substrate W, so that the indexer robot IR1 can horizontally hold two substrates W. The number of the first hands 9 to be provided in the indexer robot IR1 is not limited to two, but may be one or three or more. Where three or more first hands 9 are provided, the first hands 9 may be attached to a single arm in vertically spaced relation, or dedicated arms 8 may be provided to which the first hands 9 are respectively attached.

As shown in FIG. 3, the indexer robot IR1 includes a first pivot mechanism M1a and a first lift mechanism M1b incorporated therein. The first pivot mechanism M1a pivots the two first hands 9 together with the corresponding arms 8 about a vertical axis. Further, the first lift mechanism M1b (first hand movement mechanism) moves up and down the two first hands 9 together with the corresponding arms 8 along the vertical direction D1. Thus, the indexer robot IR1 can bring the first hands 9 into opposed relation to any of the carriers C and the substrate transfer unit 5.

On the other hand, the processing block 3 includes a plurality of substrate processing units 12 (e.g., eight substrate processing units 12) (second retaining unit) which each process a substrate W, and a main transport robot TR1 (second transport robot). Of the eight substrate processing units 12, four substrate processing units 12 serve for a first processing unit 13, and the other four substrate processing units 12 serve for a second processing unit 14. As shown in FIG. 2, the four substrate processing units 12 for the first processing unit 13 are vertically stacked. The four substrate processing units 12 for the second processing unit 14 are also vertically stacked. As shown in FIG. 1, the first processing unit 13 and the second processing unit 14 are spaced from each other in the carrier alignment direction U. Further, the first processing unit 13 and the second processing unit 14 are spaced from the carrier retaining unit 6 in a horizontal direction (in an opposing direction D2) perpendicular to the carrier alignment direction U. The main transport robot TR1 is disposed between the first processing unit 13 and the second processing unit 14. The main transport robot TR1 transfers a substrate W between any of the substrate processing units 12 and the substrate transfer unit 5. Further, the main transport robot TR1 performs a loading operation for loading a substrate W into any of the substrate processing units 12 and the substrate transfer unit 5, and an unloading operation for unloading a substrate W from any of the substrate processing units 12 and the substrate transfer unit 5.

As shown in FIG. 1, the main transport robot TR1 includes two arms 15, and two second hands 16. The main transport robot TR1 is capable of horizontally stretch the two arms 15 independently of each other. The second hands 16 are each provided at a distal end of the corresponding arm 15. The two second hands 16 are horizontally disposed and spaced from each other in the vertical direction D1 (in FIG. 1, the two second hands 16 are illustrated as vertically overlapping each other). The two second hands 16 are each capable of holding a substrate W, so that the main transport robot TR1 can horizontally hold two substrates W. The number of the second hands 16 to be provided in the main transport robot TR1 is not limited to two, but may be one or three or more. Where three or more second hands 16 are provided, the second hands 16 may be attached to a single arm 15 in vertically spaced relation, or dedicated arms 15 may be provided to which the second hands 16 are respectively attached.

As shown in FIG. 3, the main transport robot TR1 includes a second pivot mechanism M2a and a second lift mechanism M2b incorporated therein. The second pivot mechanism M2a pivots the two second hands 16 together with the corresponding arms 15 about a vertical axis. Further, the second lift mechanism M2b (second hand movement mechanism) moves up and down the two second hands 16 together with the corresponding arms 15 along the vertical direction D1. Thus, the main transport robot TR1 can bring the second hands 16 into opposed relation to any of the substrate processing units 12 and the substrate transfer unit 5.

The substrate processing units 12 each process a single substrate W at a time. The substrate processing units 12 each perform various types of processing operations such as a cleaning operation, an etching operation and a lift-off operation. In the first embodiment, for example, the substrate processing units each perform a scrub-cleaning operation for scrubbing the substrate W with a brush while supplying a treatment liquid to the substrate W. The first processing unit 13 is, for example, a front surface treatment unit for scrubbing a front surface of the substrate W, and the second processing unit 14 is, for example, a back surface treatment unit for scrubbing a back surface of the substrate W. More specifically, the substrate processing units 12 for the first processing unit 13 are front surface processing units 12a for scrubbing the front surface of the substrate W, while the substrate processing units 12 for the second processing unit 14 are back surface processing units 12b for scrubbing the back surface of the substrate W.

As shown in FIG. 2, the front surface treatment units 12a each include a first spin chuck 19 which horizontally holds and rotates the substrate W, a nozzle 20 which supplies the treatment liquid to an upper surface (front surface) of the substrate W, and a brush 21 to be pressed against the upper surface of the substrate W. The back surface treatment units 12b each include a second spin chuck 22 which horizontally holds and rotates the substrate W, a nozzle 20 which supplies the treatment liquid to an upper surface (back surface) of the substrate W, and a brush 21 to be pressed against the upper surface of the substrate W. The first spin chuck 19 is, for example, of a vacuum type which sucks a lower surface (back surface) of the substrate W to horizontally hold the substrate W and rotates the substrate W about a vertical axis extending through the center of the substrate W. The second spin chuck 22 is, for example, of a holder type which holds a periphery of the substrate W and rotates the substrate W about a vertical axis extending through the center of the substrate W.

The substrate transfer unit 5 is disposed between the carrier retaining unit 6 and the main transport robot TR1 as seen in plan in FIG. 1. The main transport robot TR1 is horizontally opposed to the substrate transfer unit 5 (in the opposing direction D2). As shown in FIGS. 2 and 3, the substrate transfer unit 5 includes a first inversion unit 23, a plurality of forward placement units 24 vertically stacked, a plurality of return placement units 25 vertically stacked, and a second inversion unit 26. The first inversion unit 23, the forward placement units 24, the return placement units 25 and the second inversion unit 26 are vertically disposed in this order from the top. The first inversion unit 23 is accessible from the side of the main transport robot TR1, but is not accessible from the side of the indexer robot IR1. The forward placement units 24, the return placement units 25 and the second inversion unit 26 are accessible from the side of the indexer robot IR1 and from the side of the main transport robot TR1. The first inversion unit 23 and the second inversion unit 26 each horizontally hold substrates W and rotate the substrates W 180 degrees about a horizontal axis to invert the substrates W. Further, the forward placement units 24 and the return placement units 25 each receive a substrate W from either of the indexer robot IR1 and the main transport robot TR1, and retain the substrate W.

The carriers C each contain a plurality of substrates W of the same lot. A processing operation (recipe) to be performed on the substrates W are specified for each lot. Substrates of a lot specified for treating only back surfaces or front surfaces thereof are subjected to a back surface treatment or a front surface treatment, and substrates W of a lot specified for treating both surfaces (front and back surfaces) thereof are subjected to a both surface treatment. The control unit 4 controls the substrate processing apparatus 1 according to the recipe specified for each lot.

Where the substrates W are individually subjected to the back surface treatment, for example, the control unit 4 controls the indexer robot IR1, the main transport robot TR1 and the like to repeatedly perform the following operation sequence. A plurality of substrates W are retained in each of the carriers C with their front surfaces (device formation surfaces) up. An untreated substrate W is unloaded from one of the carriers C and loaded into the second inversion unit 26 by the indexer robot IR1 with its front surface up (first loading step). The untreated substrate W loaded into the second inversion unit 26 is inverted by the second inversion unit 26 (inverting step). Thereafter, the substrate W is unloaded from the second inversion unit 26 and loaded into one of the substrate processing units 12 (back surface treatment units 12b) by the main transport robot TR1 with its back surface up (unloading step). Thus, the back surface of the substrate W is treated.

Further, the substrate W treated in the substrate processing unit 12 (back surface treatment unit 12b) is unloaded from the substrate processing unit 12 and loaded into the first inversion unit 23 by the main transport robot TR1. The treated substrate W loaded in the first inversion unit 23 is inverted by the first inversion unit 23 and then unloaded from the first inversion unit 23 by the main transport robot TR1. Then, the treated substrate W unloaded from the first inversion unit 23 is loaded into one of the return placement units 25 by the main transport robot TR1 with its front surface up. The treated substrate W loaded into the return placement unit 25 is unloaded from the return placement unit 25 and loaded into one of the carriers C by the indexer robot IR1 with its front surface up. This operation sequence is repeatedly performed, whereby the back surfaces of the substrates W are treated.

Where the substrates W are individually subjected to the front surface treatment, the control unit 4 controls the indexer robot IR1, the main transport robot TR1 and the like to repeatedly perform the following operation sequence. An untreated substrate W is unloaded from one of the carriers C and loaded into the forward placement unit 24 by the indexer robot IR1 with its front surface up or with its front surface facing in a predetermined direction (first transporting step). At this time, a place into which the substrate W is loaded is not limited to the forward placement unit 24, but may be the second inversion unit 26. The untreated substrate W loaded into the forward placement unit 24 is further unloaded from the forward placement unit 24 and loaded into one of the substrate processing units 12 (front surface treatment units 12a) by the main transport robot TR1 with its front surface up (second transporting step). Thus, the front surface of the substrate W is treated.

The substrate W treated in the substrate processing unit 12 (front surface treatment unit 12a) is unloaded from the substrate processing unit 12 and loaded into one of the return placement units 25 by the main transport robot TR1 with its front surface up (second transporting step). Then, the treated substrate W loaded into the return placement unit 25 is further unloaded from the return placement units 25 and loaded into one of the carriers C by the indexer robot IR1 with its front surface up (first transporting step). This operation sequence is repeatedly performed, whereby the front surfaces of the substrates W are treated.

Where the substrates W are individually subjected to the both surface treatment, the control unit 4 controls the indexer robot IR1, the main transport robot TR1 and the like to repeatedly perform the following operation sequence. An untreated substrate W is unloaded from one of the carriers C and loaded into the second inversion unit 26 by the indexer robot IR1 with its front surface up (first loading step). The untreated substrate W loaded in the second inversion unit 26 is inverted by the second inversion unit 26 (inverting step). Thereafter, the substrate W is unloaded from the second inversion unit 26 and loaded into one of the substrate processing units 12 (back surface treatment units 12b) by the main transport robot TR1 with its back surface up (unloading step). Thus, the back surface of the substrate W is treated.

Subsequently, the substrate W treated in the substrate processing unit 12 (back surface treatment unit 12b) is unloaded from the substrate processing unit 12 and loaded into the first inversion unit 23 by the main transport robot TR1 with its back surface up. The substrate W loaded in the first inversion unit 23 is inverted by the first inversion unit 23 and then unloaded from the first inversion unit 23 by the main transport robot TR1. Then, the substrate W unloaded from the first inversion unit 23 is loaded into one of the substrate processing units 12 (front surface treatment units 12a) by the main transport robot TR1 with its front surface up. Thus, the front surface of the substrate W is treated.

Subsequently, the substrate W treated in the substrate processing unit 12 (front surface treatment unit 12a) is unloaded from the substrate processing unit 12 and loaded into one of the return placement units 25 by the main transport robot TR1 with its front surface up (second transporting step). Then, the treated substrate W loaded into the return placement unit 25 is unloaded from the return placement unit 25 and loaded into one of the carriers C by the indexer robot IR1 with its front surface up (first transporting step). This operation sequence is repeatedly performed, whereby the front and back surfaces of the substrates W are treated.

Figure 4:
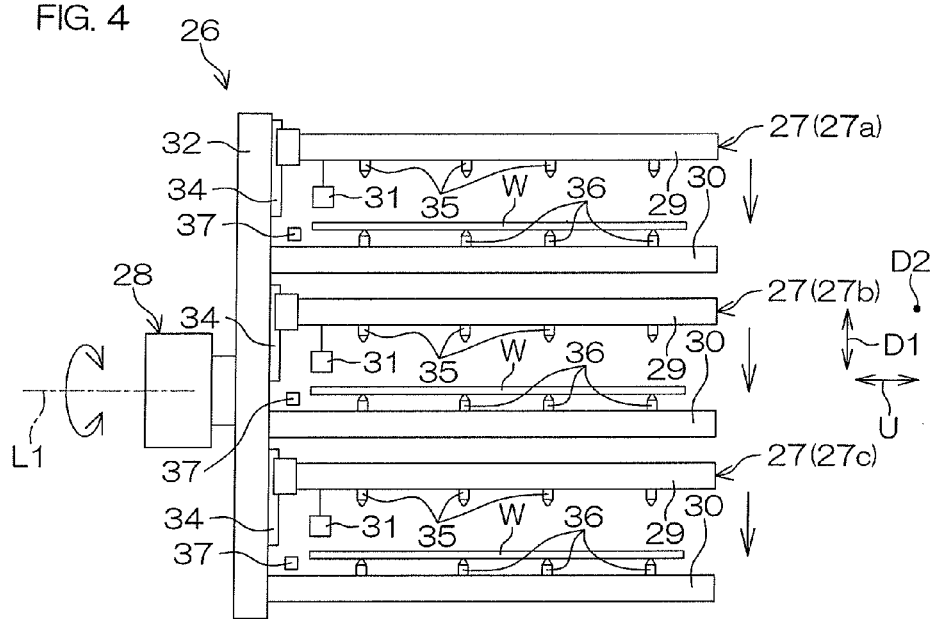
FIG. 4 is a diagram of a second inversion unit according to the first embodiment of the present invention as seen in an arrow direction IV in FIG. 3.

FIG. 4 is a diagram of the second inversion unit 26 according to the first embodiment of the present invention as seen in an arrow direction IV in FIG. 3.

The second inversion unit 26 includes a plurality of substrate holders 27 which each hold a substrate W, and a rotation mechanism 28 which rotates the plurality of substrate holders 27. The substrate holders 27 are arranged along a predetermined arrangement direction. The rotation mechanism 28 rotates the plurality of substrate holders 27 180 degrees about an axis crossing the arrangement direction. After the rotation mechanism 28 rotates the plurality of substrate holders 27, the substrate holders 27 are arranged along the arrangement direction in a post-rotation arrangement sequence reverse to a pre-rotation arrangement sequence in which the substrate holders 27 are arranged before the rotation.

In the first embodiment, for example, three substrate holders 27 (a first substrate holder 27a, a second substrate holder 27b and a third substrate holder 27c) are provided in the second inversion unit 26. The first substrate holder 27a, the second substrate holder 27b and the third substrate holder 27c are arranged vertically (D1) in this arrangement sequence from the top. That is, the vertical direction D1 is the arrangement direction in the first embodiment. The rotation mechanism 28 rotates the three substrate holders 27 180 degrees, for example, about a horizontal rotation axis L1 extending through an intermediate one (second substrate holder 27b) of the three substrate holders 27. The rotation axis L1 is, for example, parallel to the carrier alignment direction U, and perpendicular to the arrangement direction D1 and the opposing direction D2. Therefore, the rotation mechanism 28 rotates the three substrate holders 27 180 degrees along a plane perpendicular to the carrier alignment direction U.

The substrate holders 27 each include, for example, a movable plate 29 and a stationary plate 30 vertically opposed to each other, and an actuator 31 which translationally moves the movable plate 29 along the vertical direction D1. The movable plate 29 is, for example, a rectangular plate. The stationary plate 30 is, for example, a rectangular plate having substantially the same size as the movable plate 29. The movable plates 29 and the stationary plates 30 of the three substrate holders 27 are horizontally disposed in overlying relation as seen in plan, and arranged along the vertical direction D1. Further, the movable plates 29 and the stationary plates 30 of the three substrate holders 27 are alternately arranged along the vertical direction D1.

The second inversion unit 26 further includes a support plate 32 disposed vertically, and a plurality of guides 34 (e.g., three guides) each extending vertically (D1). The stationary plates 30 and the movable plates 29 are disposed on a side of the support plate 32 opposite from the rotation mechanism 28. The three stationary plates 30 are horizontally fixed to the support plate 32 in vertically (D1) equidistantly spaced relation. Further, the movable plates 29 are horizontally attached to the support plate 32 via the corresponding guides 34. The movable plates 29 are translationally movable vertically (D1) along the corresponding guides 34. The rotation mechanism 28 is attached to a side of the support plate 32 opposite from the stationary plates 30 and the movable plates 29.

The actuator 31 includes, for example, an air cylinder. The actuator 31 translationally moves the movable plate 29 along the vertical direction D1 between an open position (a position shown in FIG. 4) and a closed position. With the movable plate 29 located at the open position, the first hand 9 of the indexer robot IR1 and the second hand 16 of the main transport robot TR1 can be advanced into a space between the movable plate 29 and the stationary plate 30 provided in pair. With the movable plate 29 located at the closed position, a distance between the movable plate 29 and the stationary plate 30 provided in pair is smaller than a distance measured when the movable plate 29 is located at the open position. The rotation mechanism 28 includes, for example, a motor. The rotation mechanism 28 rotates the support plate 32 180 degrees about the rotation axis L1. Thus, the three substrate holders 27 are unitarily rotated.

The movable plate 29 has a plurality of first support pins 35 provided on a surface (lower surface in FIG. 4) thereof opposed to the corresponding stationary plate 30 as projecting from this surface. The stationary plate 30 has a plurality of second support pins 36 provided on a surface (upper surface in FIG. 4) thereof opposed to the corresponding movable plate 29 as projecting from this surface. The first support pins 35 are arranged in properly spaced relation on a circle corresponding to the outer periphery of the substrate W. Similarly, the second support pins 36 are arranged in properly spaced relation on a circle corresponding to the outer periphery of the substrate W.

When the stationary plate 30 is located below the corresponding movable plate 29 (as shown in FIG. 4), the stationary plate 30 supports a substrate W with distal ends of the second support pins 36 thereof in point contact with a peripheral portion of a lower surface of the substrate W. Further, when the movable plate 29 is located below the corresponding stationary plate 30, the movable plate 29 supports a substrate W with distal ends of the first support pins 35 thereof in point contact with a peripheral portion of a lower surface of the substrate W. The substrate holders 27 each further include a substrate detection sensor 37, which detects the presence or absence of the substrate W in the substrate holder 27. Detection values of the substrate detection sensors 37 of the respective substrate holders 27 are inputted to the control unit 4.

With the movable plates 29 each located at the open position (at the position shown in FIG. 4), the transport robots (the indexer robot IR1 and the main transport robot TR1) are permitted to simultaneously load two substrates W into two vertically adjacent substrate holders 27, respectively, or simultaneously unload two substrates W from two vertically adjacent substrate holders 27, respectively. With the movable plates 29 each located at the open position, the transport robots are also permitted to load a single substrate W into one of the three substrate holders 27, or unload a single substrate W from one of the three substrate holders 27.

With the movable plates 29 each located at the open position, a substrate W transported by either of the transport robots is further transported into the space between the movable plate 29 and the stationary plate 30 provided in pair, and supported by the movable plate 29 or the stationary plate 30. The control unit 4 controls the actuator 31 to move the movable plate 29 to the closed position with the substrate W being supported by the movable plate 29 or the stationary plate 30, thereby reducing the distance between the movable plate 29 and the stationary plate 30 provided in pair. Thus, the first support pins 35 and the second support pins 36 are brought into point contact with the substrate W, whereby the substrate W is held between the movable plate 29 and the stationary plate 30 provided in pair.

With the substrate W thus held between the movable plate 29 and the stationary plate 30, the control unit 4 controls the rotation mechanism 28 to rotate the support plate 32 180 degrees about the rotation axis L1 to invert the substrate W. Then, the control unit 4 controls the corresponding actuator 31 to move the movable plate 29 to the open position to increase the distance between the movable plate 29 and the stationary plate 30 provided in pair. Thus, the substrate W is released from the movable plate 29 and the stationary plate 30. Thereafter, the substrate W supported on the movable plate 29 or the stationary plate 30 is unloaded from the second inversion unit 26 by the indexer robot IR1 or the main transport robot TR1.

FIGS. 5A, 5B, 5C and 5D are schematic diagrams for explaining an exemplary operation to be performed by the indexer robot IR1, the main transport robot TR1 and the second inversion unit 26 according to the first embodiment of the present invention to transport a plurality of substrates W from the carrier retaining unit 6 to the substrate processing units 12 while causing the second inversion unit 26 to perform a substrate inverting operation.

The control unit 4 causes the indexer robot IR1 to simultaneously transport n substrates W (wherein n is an integer not smaller than 2) from one of the carriers C to the second inversion unit 26, and load the n substrates W into the second inversion unit 26. The control unit 4 causes the second inversion unit 26 to invert the substrates W, and then causes the main transport robot TR1 to unload the n substrates W in a group of m (wherein m is a positive integer that is smaller than n and a divisor of n) from the second inversion unit 26.

In the first embodiment, the control unit 4 causes the indexer robot IR1 to simultaneously transport two substrates W from one of the carriers C to the second inversion unit 26, and load the two substrates W into the second inversion unit 26. The control unit 4 causes the second inversion unit 26 to invert the substrates W, and then causes the main transport robot TR1 to individually unload the two substrates W from the second inversion unit 26. That is, n is 2, and m is 1 in the first embodiment. Further, the number of the substrate holders 27 provided in the second inversion unit 26 is n+m, which is 3 in the first embodiment.

An exemplary operation to be performed by the indexer robot IR1, the main transport robot TR1 and the second inversion unit 26 to transport a plurality of substrates W from the carrier retaining unit 6 to the substrate processing units 12 while causing the second inversion unit 26 to perform the substrate inverting operation will hereinafter be described specifically.

Figure 5A:
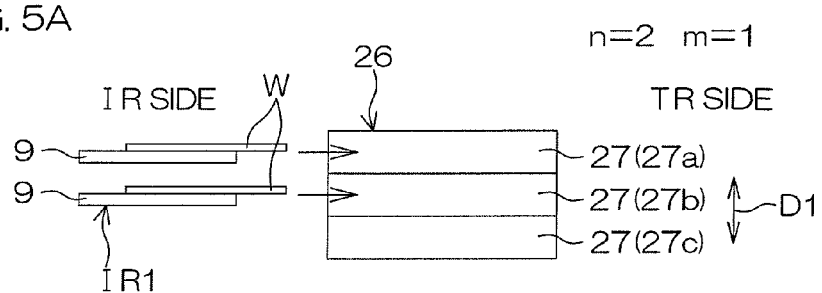
FIGS. 5A, 5B, 5C and 5D are schematic diagrams for explaining an exemplary operation to be performed by an indexer robot, a main transport robot and the second inversion unit according to the first embodiment of the present invention to transport a plurality of substrates from a carrier retaining unit to substrate processing units while causing the second inversion unit to perform a substrate inverting operation.

The control unit 4 causes the indexer robot IR1 to unload two substrates W from one of the carriers C and, as shown in FIG. 5A, simultaneously transport the two substrates W from the carrier C to the second inversion unit 26. Then, as shown in FIG. 5A, the control unit 4 causes the indexer robot IR1 to simultaneously load these two substrates W into two substrate holders (the first substrate holder 27a and the second substrate holder 27b in FIG. 5A) consecutively arranged vertically (D1) from one of opposite sides defined with respect to the vertical direction D1 (first loading step).

Figure 5B:
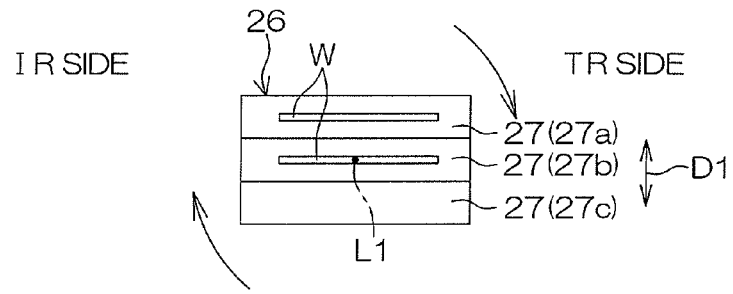
Figure 5C:
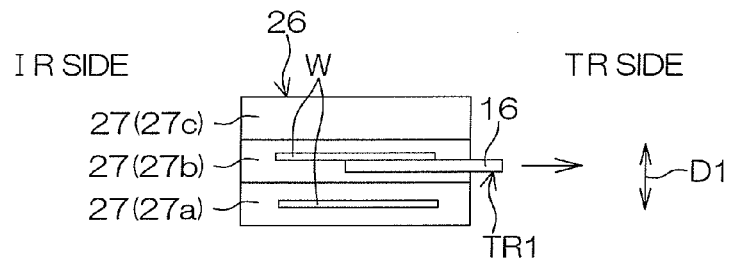

Thereafter, as shown in FIG. 5B, the control unit 4 causes the rotation mechanism 28 to rotate the three substrate holders 27 180 degrees about the rotation axis L1 to invert the substrates W (inverting step). Thus, as shown in FIG. 5C, the three substrate holders 27 are arranged vertically (D1) in the post-rotation arrangement sequence reverse to the pre-rotation arrangement sequence. That is, the first substrate holder 27a, the second substrate holder 27b and the third substrate holder 27c are previously arranged vertically (D1) in this sequence from the top and, after the rotation, the third substrate holder 27c, the second substrate holder 27b and the first substrate holder 27a are arranged vertically (D1) in this sequence from the top.

Figure 5D:
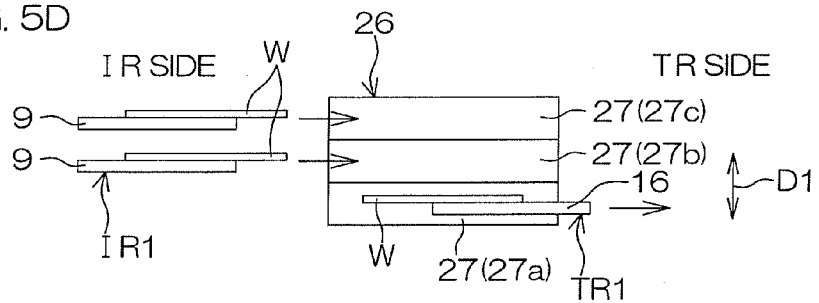

After the three substrate holders 27 are rotated 180 degrees, the control unit 4 causes the main transport robot TR1 to unload the two substrates W from the two substrate holders 27, respectively, and then load these two substrates W into the substrate processing units 12 (unloading step). More specifically, as shown in FIG. 5C, the control unit 4 causes the main transport robot TR1 to unload a substrate W (first substrate W) from the second substrate holder 27b, and load the substrate W into one of the substrate processing units 12. Thereafter, as shown in FIG. 5D, the control unit 4 causes the main transport robot TR1 to unload a substrate W (second substrate W) from the first substrate holder 27a, and load the substrate W into another of the substrate processing units 12. Thus, the control unit 4 individually unloads the substrates W in a sequence from the one side defined with respect to the vertical direction D1.

After the main transport robot TR1 unloads the substrate W (first substrate W) from the second substrate holder 27b, as shown in FIG. 5D, the upper two substrate holders 27 (the third substrate holder 27c and the second substrate holder 27b in FIG. 5D) are empty. After the main transport robot TR1 unloads the first substrate W, as shown in FIG. 5D, the control unit 4 causes the indexer robot IR1 to simultaneously load two substrates W into two substrate holders 27 (the third substrate holder 27c and the second substrate holder 27b in FIG. 5D) consecutively arranged vertically (D1) from the one side defined with respect to the vertical direction D1 (second loading step).

After the indexer robot IR1 simultaneously loads the two substrates W again and the main transport robot TR1 unloads the substrate W (second substrate W) from the first substrate holder 27a, the control unit 4 causes the rotation mechanism 28 to rotate the three substrate holders 27 180 degrees about the rotation axis L1 to invert the substrates W. Then, the control unit causes the main transport robot TR1 to unload the substrate W from the second substrate holder 27b again. The control unit 4 repeatedly performs this operation sequence, whereby the plurality of substrates W are transported from the carrier C to the substrate processing units 12.

The loading of the two substrates W by the indexer robot IR1 after the unloading of the first substrate W by the main transport robot TR1 may precede or follow the unloading of the second substrate W by the main transport robot TR1. Further, the loading of the two substrates W by the indexer robot IR1 may be concurrent with the unloading of the second substrate W by the main transport robot TR1.

In the first embodiment, as described above, the plurality of substrates W are transported from the carrier retaining unit 6 to the substrate processing units 12 in the following manner, while the substrate inverting operation is performed by the second inversion unit 26. The control unit 4 causes the indexer robot IR1 to load the two substrates W into the upper two of the three vertically (D1) arranged substrate holders 27, respectively (first loading step). Then, the control unit 4 rotates the three substrate holders 27 180 degrees about the rotation axis L1 (inverting step). Thus, the upper two substrate holders 27 retaining the substrates W loaded therein are moved to the lower side. The control unit 4 causes the main transport robot TR1 to unload the substrate W (first substrate W) from an upper one of the two substrate holders 27 moved to the lower side (a part of the unloading step). Thus, the upper two substrate holders 27 are emptied. After the unloading of the first substrate W by the main transport robot TR1, the control unit 4 causes the indexer robot IR1 to load two substrates W again into the upper two substrate holders 27, respectively (second loading step).

In this manner, the upper two substrate holders 27 are emptied before all the substrates W (the two substrates W) previously loaded by the indexer robot IR1 are unloaded. Therefore, the control unit 4 can cause the indexer robot IR1 to load two substrates W again into the upper two substrate holders 27 before all the substrates W previously loaded by the indexer robot IR1 are unloaded. Thus, the control unit 4 does not have to keep the indexer robot IR1 in standby until all the substrates W previously loaded by the indexer robot IR1 are unloaded. This reduces the standby period of the indexer robot IR1. Therefore, the substrate transport period can be reduced, whereby the throughput (the number of substrates W treated per unit time) of the substrate processing apparatus 1 can be increased.

In the first embodiment, the number of the substrates W to be transported at a time by the indexer robot IR1 is two. Therefore, provision of four substrate holders 27 would make it possible to reduce the standby period of the indexer robot IR1 required for transporting a plurality of substrates W from the carrier retaining unit 6 to the substrate processing units 12 while causing the second inversion unit 26 to perform the substrate inverting operation. That is, where the second inversion unit 26 includes four substrate holders 27 arranged vertically (D1), two substrates W are loaded into the upper two substrate holders 27, respectively, by the indexer robot IR1, and then the four substrate holders 27 are rotated 180 degrees about the rotation axis L1, whereby lower two (empty) substrate holders 27 each retaining no substrate W can be moved to the upper side. Therefore, the control unit 4 can cause the indexer robot IR1 to load two substrates W into the upper two substrate holders 27, respectively, before the previously loaded substrates W are unloaded by the main transport robot TR1.

Where the number of the substrate holders 27 is twice the number of the substrates W to be simultaneously transported by the indexer robot IR1, it would be possible to reduce the standby period of the indexer robot IR1. In this case, however, the greater number of substrate holders 27 would increase the size of the second inversion unit 26. More specifically, the substrate holders 27 are arranged vertically (D1) in the first embodiment, so that the second inversion unit 26 would have an increased height. In the first embodiment, on the other hand, the standby period of the indexer robot IR1 is reduced by using the three substrate holders 27 that are smaller in number than twice the number of the substrates W to be transported at a time by the indexer robot IR1 (four substrates W). This suppresses or prevents the size increase of the second inversion unit 26, thereby substantially preventing the size increase of the substrate processing apparatus 1.

Further, the second inversion unit 26 rotates the plurality of substrate holders 27 along the plane perpendicular to the carrier alignment direction U between the main transport robot TR1 and a position (shown in FIG. 1, and hereinafter referred to simply as "opposed position") at which the indexer robot IR1 is opposed to the second inversion unit 26. Where the second inversion unit 26 has a greater height, therefore, the opposed position should be spaced a sufficient distance from the main transport robot TR1 so as to prevent the second inversion unit 26 from colliding against the indexer robot IR1 and the main transport robot TR1 when the substrate holders 27 are rotated. If the distance between the opposed position and the main transport robot TR1 is increased, however, the substrate processing apparatus 1 tends to have an increased footprint (occupied area). Therefore, the increase in the footprint of the substrate processing apparatus 1 can be substantially prevented by suppressing or preventing the increase in the height of the second inversion unit 26.

In the first embodiment, the control unit 4 can perform the second loading step concurrently with the unloading step. That is, the control unit 4 can cause the indexer robot IR1 to load two substrates W into the second inversion unit 26 before or during the unloading of the second substrate W by the main transport robot TR1. Therefore, the substrate transport period can be reduced as compared with the case in which the loading of the two substrates W by the indexer robot IR1 (second loading step) follows the unloading of the second substrate W (unloading step). This further increases the throughput.

In the first embodiment, the control unit 4 causes the indexer robot IR1 to simultaneously load two substrates W into two of the substrate holders 27, respectively, in the first loading step and in the second lading step. Therefore, the substrate loading period can be reduced as compared with the case in which two substrates W are successively loaded into the two substrate holders 27, respectively. This reduces the substrate transport period.

In the first embodiment, n=2 and m=1, and n has a value that is equal to m multiplied by 2. The uppermost substrate holder 27 (or upper m substrate holders 27) retains no substrate W, and the other two substrate holders 27 (n substrate holders 27) each retain a substrate W loaded therein after the inversion step before the unloading of the substrates W by the main transport robot TR1 (before the unloading step). In the unloading step, the two substrates W (n substrates W) respectively retained in the two substrate holders (in the n substrate holders 27) are unloaded one by one (in a group of m) in a sequence from the upper side by the main transport robot TR1. When the main transport robot TR1 performs the substrate unloading operation once, upper two (m+m) of the substrate holders 27 are emptied. Therefore, the control unit 4 can start the loading of substrates W by the indexer robot IR1 (second loading step) after the main transport robot TR1 performs the substrate unloading operation once for unloading the single substrate W (m substrates W). That is, the control unit 4 does not have to keep the indexer robot IR1 in standby until the main transport robot TR1 performs the substrate unloading operation a plurality of times. This reduces the standby period of the indexer robot IR1.

In the first embodiment, the control unit 4 controls the IR movement mechanism 7 to horizontally move the indexer robot IR1 between the carriers C and the substrate transfer unit 5. Therefore, a range in which the indexer robot IR1 horizontally transports the substrates W is wider than a range in which the main transport robot TR1 transports the substrates W. Accordingly, the indexer robot IR1 is heavier in transportation duty than the main transport robot TR1. Hence, the reduction in the standby period of the indexer robot IR1 makes it possible to substantially prevent the indexer robot IR1 from limiting the processing rate of the substrate processing apparatus 1. The first embodiment suppresses or prevents the height increase of the second inversion unit 26 and, hence, the increase in the vertical (D1) movement range of the two first hands 9 of the indexer robot IR1. This substantially prevents the increase in the substrate transport range of the indexer robot IR1 and, hence, the increase in the substrate transport period of the indexer robot IR1.

Second Embodiment

FIGS. 6A, 6B, 6C and 6D are schematic diagrams for explaining an exemplary operation to be performed by an indexer robot IR2, a main transport robot TR1 and a second inversion unit 226 according to a second embodiment of the present invention to transport a plurality of substrates W from a carrier retaining unit 6 to substrate processing units 12 while causing the second inversion unit 226 to perform a substrate inverting operation. In FIGS. 6A, 6B, 6C and 6D, components corresponding to those shown in FIGS. 1 to 5D will be designated by the same reference characters as in FIGS. 1 to 5D, and duplicate description of these components will be omitted.

Major differences between the first embodiment and the second embodiment are the number of substrates W to be simultaneously transported by the indexer robot IR2, and the number of substrate holders 27 provided in the second inversion unit 226.

In the second embodiment, the number of the substrates W to be simultaneously transported by the indexer robot IR2 is three. As in the first embodiment, the control unit 4 causes the main transport robot TR1 to individually unload substrates W from the second inversion unit 226. In the second embodiment, n is 3, and m is 1. Therefore, the number (n+m) of the substrate holders 27 provided in the second inversion unit 226 is four. That is, four substrate holders 27 (a first substrate holder 27a, a second substrate holder 27b, a third substrate holder 27c and a fourth substrate holder 27d) are provided in the second inversion unit 226.

An exemplary operation to be performed by the indexer robot IR2, the main transport robot TR1 and the second inversion unit 226 to transport a plurality of substrates W from the carrier retaining unit 6 to the substrate processing units 12 while causing the second inversion unit 226 to perform the substrate inverting operation will hereinafter be described specifically.

Figure 6A:
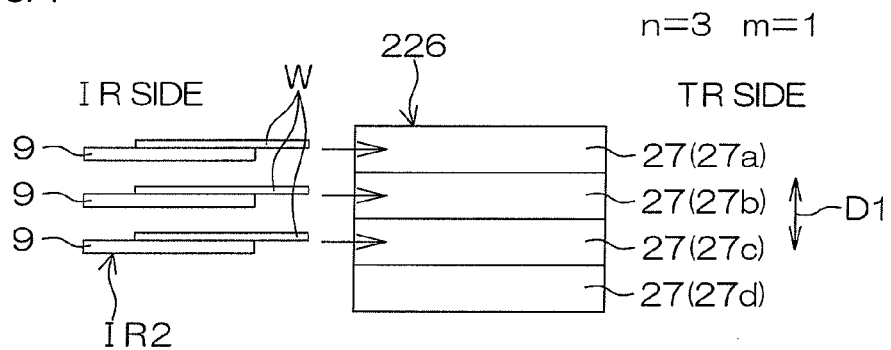
FIGS. 6A, 6B, 6C and 6D are schematic diagrams for explaining an exemplary operation to be performed by an indexer robot, a main transport robot and a second inversion unit according to a second embodiment of the present invention to transport a plurality of substrates from a carrier retaining unit to substrate processing units while causing the second inversion unit to perform a substrate inverting operation.

As shown in FIG. 6A, the control unit 4 causes the indexer robot IR2 to simultaneously transport three substrates W from one of the carriers C to the second inversion unit 226. Then, as shown in FIG. 6A, the control unit 4 causes the indexer robot IR2 to simultaneously load these three substrates W into three substrate holders 27 (the first substrate holder 27a, the second substrate holder 27b and the third substrate holder 27c in FIG. 6A) consecutively arranged vertically (D1) from one of opposite sides defined with respect to the vertical direction D1 (first loading step).

Figure 6B:
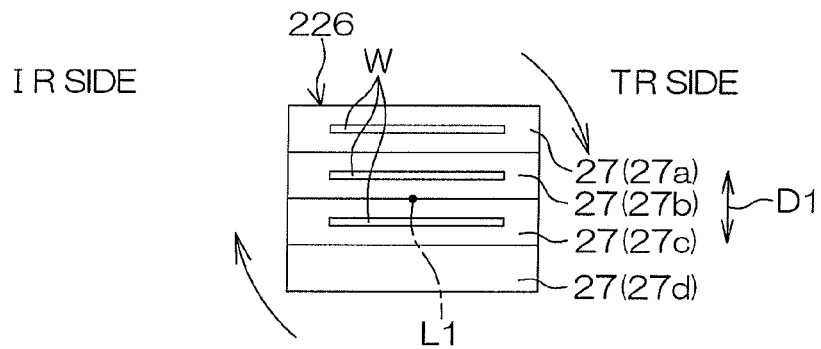
Figure 6C:
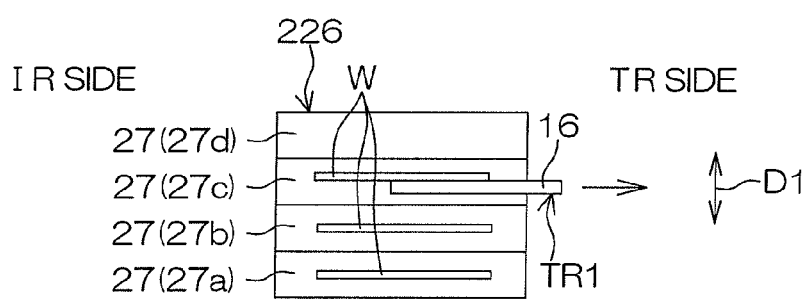

Thereafter, as shown in FIG. 6B, the control unit 4 causes the rotation mechanism 28 to rotate the four substrate holders 27 180 degrees about the rotation axis L1 to invert the substrates W. Thus, as shown in FIG. 6C, the four substrate holders 27 are arranged vertically (D1) in a post-rotation arrangement sequence reverse to a pre-rotation arrangement sequence in which the substrate holders 27 are arranged before the rotation. That is, the first substrate holder 27a, the second substrate holder 27b, the third substrate holder 27c and the fourth substrate holder 27d are previously arranged vertically (D1) in this sequence from the top and, after the rotation, the fourth substrate holder 27d, the third substrate holder 27c, the second substrate holder 27b and the first substrate holder 27a are arranged vertically (D1) in this sequence from the top.

After the four substrate holders 27 are rotated 180 degrees, the control unit 4 causes the main transport robot TR1 to unload the three substrates W from the three substrate holders 27, respectively, and then load these three substrates W into the substrate processing units 12 (unloading step). More specifically, as shown in FIG. 6C, the control unit 4 causes the main transport robot TR1 to unload a substrate W (first substrate W) from the third substrate holder 27c, and load the substrate W into one of the substrate processing units 12. Thereafter, the control unit 4 causes the main transport robot TR1 to unload a substrate W (second substrate W) from the second substrate holder 27b, and load the substrate W into another of the substrate processing units 12. Thus, the control unit 4 individually unloads the substrates W in a sequence from the one side defined with respect to the vertical direction D1.

Figure 6D:
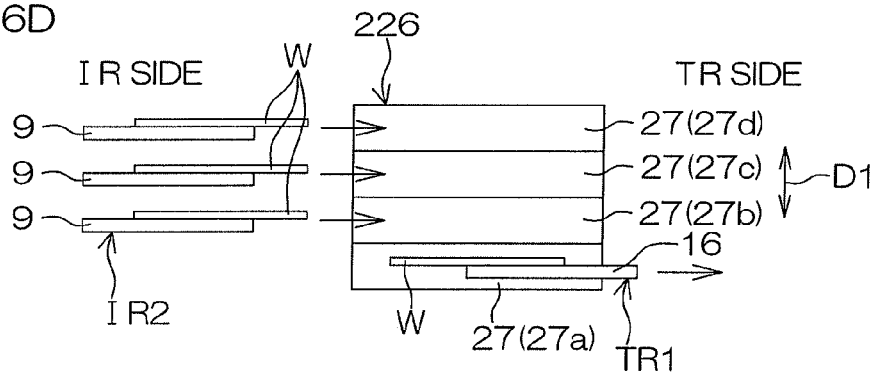

After the main transport robot TR1 unloads the substrate W (second substrate W) from the second substrate holder 27b, as shown in FIG. 6D, the upper three substrate holders 27 (the fourth substrate holder 27d, the third substrate holder 27c and the second substrate holder 27b in FIG. 6D) are empty. After the main transport robot TR1 unloads the second substrate W, as shown in FIG. 6D, the control unit 4 causes the indexer robot IR2 to simultaneously load three substrates W into three substrate holders 27 consecutively arranged vertically (D1) from the one side defined with respect to the vertical direction D1 (second loading step).

After the indexer robot IR2 simultaneously loads the three substrates W again and the main transport robot TR1 unloads a substrate W (third substrate W) from the first substrate holder 27a, the control unit 4 causes the rotation mechanism 28 to rotate the four substrate holders 27 180 degrees about the rotation axis L1 to invert the substrates W. Then, the control unit 4 causes the main transport robot TR1 to unload the substrates W from the second inversion unit 226 again. The control unit 4 repeatedly performs this operation sequence, whereby the plurality of substrates W are transported from the carrier C to the substrate processing units 12.

The loading of the three substrates W by the indexer robot IR2 after the unloading of the second substrate W by the main transport robot TR1 may precede or follow the unloading of the third substrate W by the main transport robot TR1. The loading of the three substrates W by the indexer robot IR2 may be concurrent with the unloading of the third substrate W by the main transport robot TR1.

Third Embodiment

FIGS. 7A, 7B, 7C and 7D are schematic diagrams for explaining an exemplary operation to be performed by an indexer robot IR3, a main transport robot TR1 and a second inversion unit 326 according to a third embodiment of the present invention to transport a plurality of substrates W from a carrier retaining unit 6 to substrate processing units 12 while causing the second inversion unit 326 to perform a substrate inverting operation. In FIGS. 7A, 7B, 7C and 7D, components corresponding to those shown in FIGS. 1 to 6D will be designated by the same reference characters as in FIGS. 1 to 6D, and duplicate description of these components will be omitted.

Major differences between the first embodiment and the third embodiment are the number of substrates W to be simultaneously transported by the indexer robot IR3, and the number of substrate holders 27 provided in the second inversion unit 326.

In the third embodiment, the number of the substrates W to be simultaneously transported by the indexer robot IR3 is four. As in the first embodiment, the control unit 4 causes the main transport robot TR1 to individually unload substrates W from the second inversion unit 326. In the third embodiment, n is 4, and m is 1. Therefore, the number (n+m) of the substrate holders 27 provided in the second inversion unit 326 is five. That is, five substrate holders 27 (a first substrate holder 27a, a second substrate holder 27b, a third substrate holder 27c, a fourth substrate holder 27d and a fifth substrate holder 27e) are provided in the second inversion unit 326.

An exemplary operation to be performed by the indexer robot IR3, the main transport robot TR1 and the second inversion unit 326 to transport a plurality of substrates W from the carrier retaining unit 6 to the substrate processing units 12 while causing the second inversion unit 326 to perform the substrate inverting operation will hereinafter be described specifically.

Figure 7A:
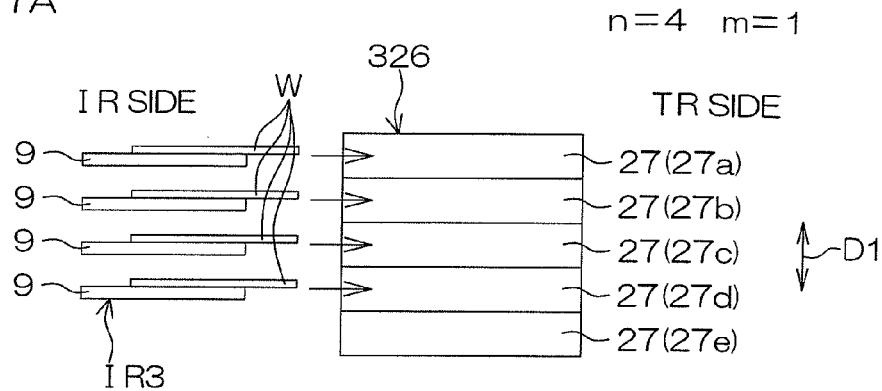
FIGS. 7A, 7B, 7C and 7D are schematic diagrams for explaining an exemplary operation to be performed by an indexer robot, a main transport robot and a second inversion unit according to a third embodiment of the present invention to transport a plurality of substrates from a carrier retaining unit to substrate processing units while causing the second inversion unit to perform a substrate inverting operation.

As shown in FIG. 7A, the control unit 4 causes the indexer robot IR3 to simultaneously transport four substrates W from one of the carriers C to the second inversion unit 326. Then, as shown in FIG. 7A, the control unit 4 causes the indexer robot IR3 to simultaneously load these four substrates W into four substrate holders 27 (the first substrate holder 27a, the second substrate holder 27b, the third substrate holder 27c and the fourth substrate holder 27d in FIG. 7A) consecutively arranged vertically (D1) from one of opposite sides defined with respect to the vertical direction D1 (first loading step).

Figure 7B:
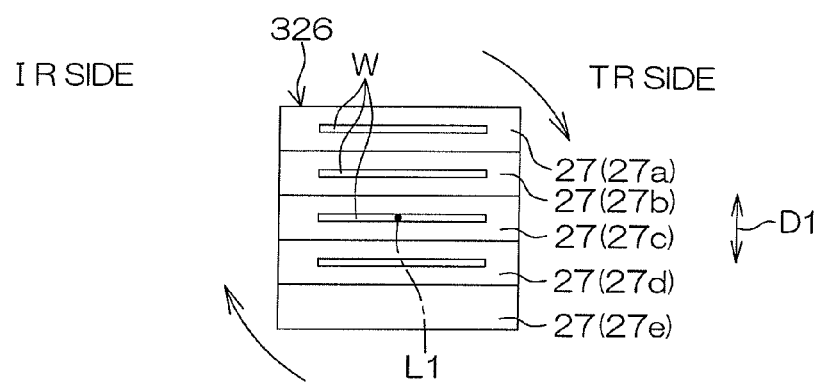
Figure 7C:
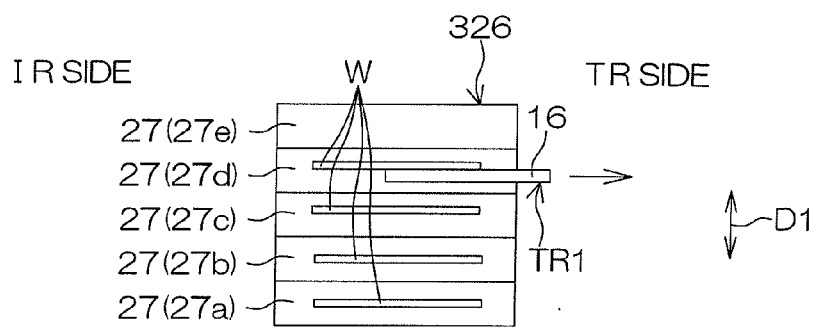

Thereafter, as shown in FIG. 7B, the control unit 4 causes the rotation mechanism 28 to rotate the five substrate holders 27 180 degrees about the rotation axis L1 to invert the substrates W. Thus, as shown in FIG. 7C, the five substrate holders 27 are arranged vertically (D1) in a post-rotation arrangement sequence reverse to a pre-rotation arrangement sequence in which the substrate holders 27 are arranged before the rotation. That is, the first substrate holder 27a, the second substrate holder 27b, the third substrate holder 27c, the fourth substrate holder 27d and the fifth substrate holder 27e are previously arranged vertically (D1) in this sequence from the top and, after the rotation, the fifth substrate holder 27e, the fourth substrate holder 27d, the third substrate holder 27c, the second substrate holder 27b and the first substrate holder 27a are arranged vertically (D1) in this sequence from the top.

After the five substrate holders 27 are rotated 180 degrees, the control unit 4 causes the main transport robot TR1 to unload the four substrates W from the four substrate holders 27, respectively, and then load these four substrates W into the substrate processing units 12 (unloading step). More specifically, as shown in FIG. 7C, the control unit 4 causes the main transport robot TR1 to unload a substrate W (first substrate W) from the fourth substrate holder 27d, and load the substrate W into one of the substrate processing units 12. Thereafter, the control unit 4 causes the main transport robot TR1 to unload a substrate W (second substrate W) from the third substrate holder 27c, and load the substrate W into another of the substrate processing units 12. Thus, the control unit 4 individually unloads the substrates W in a sequence from the one side defined with respect to the vertical direction D1.

Figure 7D:
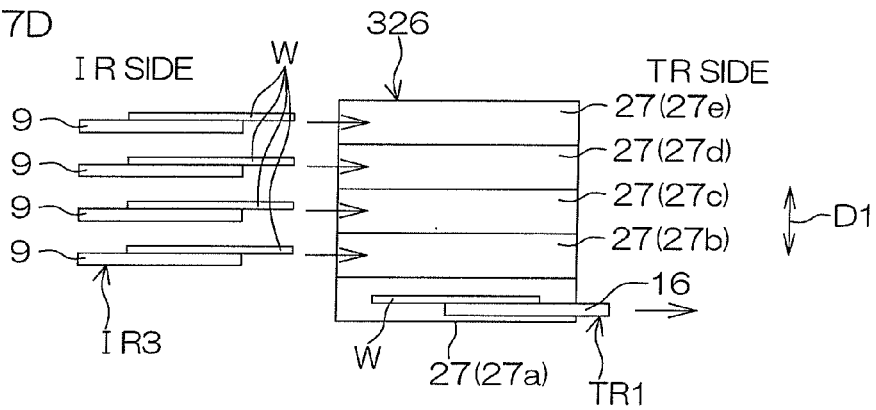

After the main transport robot TR1 unloads a substrate W (third substrate W) from the second substrate holder 27b, as shown in FIG. 7D, the upper four substrate holders 27 (the fifth substrate holder 27e, the fourth substrate holder 27d, the third substrate holder 27c and the second substrate holder 27b in FIG. 7D) are empty. After the main transport robot TR1 unloads the third substrate W, as shown in FIG. 7D, the control unit 4 causes the indexer robot IR3 to simultaneously load four substrates W into four substrate holders 27 consecutively arranged vertically (D1) from the one side defined with respect to the vertical direction D1 (second loading step).

After the indexer robot IR3 simultaneously loads the four substrates W again and the main transport robot TR1 unloads a substrate W (fourth substrate W) from the first substrate holder 27a, the control unit 4 causes the rotation mechanism 28 to rotate the five substrate holders 27 180 degrees about the rotation axis L1 to invert the substrates W. Then, the control unit 4 causes the main transport robot TR1 to unload the substrates W from the second inversion unit 326 again. The control unit 4 repeatedly performs this operation sequence, whereby the plurality of substrates W are transported from the carrier C to the substrate processing units 12.

The loading of the four substrates W by the indexer robot IR3 after the unloading of the third substrate W by the main transport robot TR1 may precede or follow the unloading of the fourth substrate W by the main transport robot TR1. The loading of the four substrates W by the indexer robot IR3 may be concurrent with the unloading of the fourth substrate W by the main transport robot TR1.

Fourth Embodiment

FIGS. 8A, 8B, 8C and 8D are schematic diagrams for explaining an exemplary operation to be performed by an indexer robot IR4, a main transport robot TR1 and a second inversion unit 426 according to a fourth embodiment of the present invention to transport a plurality of substrates W from a carrier retaining unit 6 to substrate processing units 12 while causing the second inversion unit 426 to perform a substrate inverting operation. In FIGS. 8A, 8B, 8C and 8D, components corresponding to those shown in FIGS. 1 to 7D will be designated by the same reference characters as in FIGS. 1 to 7D, and duplicate description of these components will be omitted.

Major differences between the first embodiment and the fourth embodiment are the number of substrates W to be simultaneously transported by the indexer robot IR4, and the number of substrate holders 27 provided in the second inversion unit 426.

In the fourth embodiment, the number of the substrates W to be simultaneously transported by the indexer robot IR4 is five. As in the first embodiment, the control unit 4 causes the main transport robot TR1 to individually unload substrates W from the second inversion unit 426. In the fourth embodiment, n is 5, and m is 1. Therefore, the number (n+m) of the substrate holders 27 provided in the second inversion unit 426 is six. That is, six substrate holders 27 (a first substrate holder 27*a*, a second substrate holder 27*b*, a third substrate holder 27*c*, a fourth substrate holder 27*d*, a fifth substrate holder 27*e* and a sixth substrate holder 27*f*) are provided in the second inversion unit 426.

An exemplary operation to be performed by the indexer robot IR4, the main transport robot TR1 and the second inversion unit 426 to transport a plurality of substrates W from the carrier retaining unit 6 to the substrate processing units 12 while causing the second inversion unit 426 to perform the substrate inverting operation will hereinafter be described specifically.

Figure 8A:
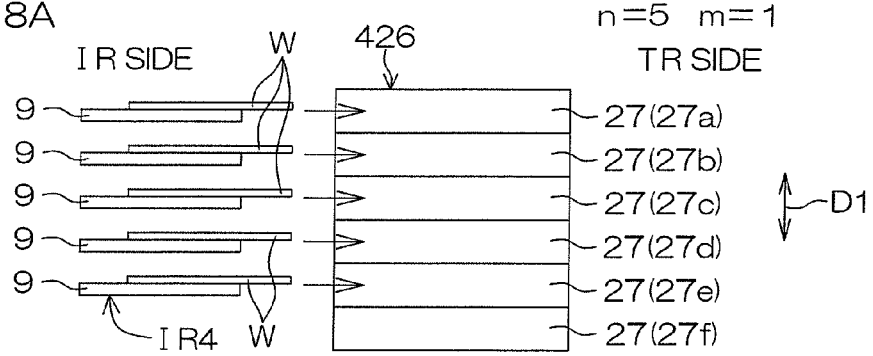
FIGS. 8A, 8B, 8C and 8D are schematic diagrams for explaining an exemplary operation to be performed by an indexer robot, a main transport robot and a second inversion unit according to a fourth embodiment of the present invention to transport a plurality of substrates from a carrier retaining unit to substrate processing units while causing the second inversion unit to perform a substrate inverting operation.

As shown in FIG. 8A, the control unit 4 causes the indexer robot IR4 to simultaneously transport five substrates W from one of the carriers C to the second inversion unit 426. Then, as shown in FIG. 8A, the control unit 4 causes the indexer robot IR4 to simultaneously load these five substrates W into five substrate holders 27 (the first substrate holder 27*a*, the second substrate holder 27*b*, the third substrate holder 27*c*, the fourth substrate holder 27*d* and the fifth substrate holder 27*e* in FIG. 8A) consecutively arranged vertically (D1) from one of opposite sides defined with respect to the vertical direction D1 (first loading step).

Figure 8B:
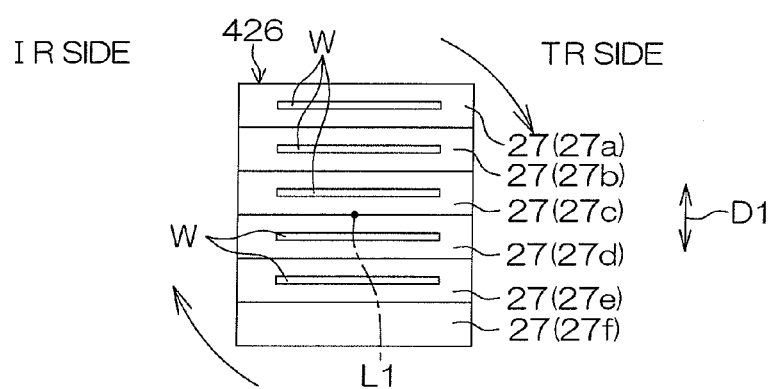
Figure 8C:
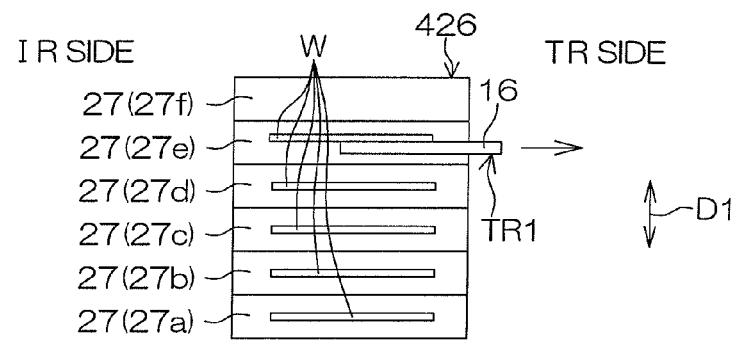

Thereafter, as shown in FIG. 8B, the control unit 4 causes the rotation mechanism 28 to rotate the six substrate holders 27 180 degrees about the rotation axis L1 to invert the substrates W. Thus, as shown in FIG. 8C, the six substrate holders 27 are arranged vertically (D1) in a post-rotation arrangement sequence reverse to a pre-rotation arrangement sequence in which the substrate holders 27 are arranged before the rotation. That is, the first substrate holder 27*a*, the second substrate holder 27*b*, the third substrate holder 27*c*, the fourth substrate holder 27*d*, the fifth substrate holder 27*e* and the sixth substrate holder 27*f* are previously arranged vertically (D1) in this sequence from the top and, after the rotation, the sixth substrate holder 27*f*, the fifth substrate holder 27*e*, the fourth substrate holder 27*d*, the third substrate holder 27*c*, the second substrate holder 27*b* and the first substrate holder 27*a* are arranged vertically (D1) in this sequence from the top.

After the six substrate holders 27 are rotated 180 degrees, the control unit 4 causes the main transport robot TR1 to unload the five substrates W from the five substrate holders 27, respectively, and then load these five substrates W into the substrate processing units 12 (unloading step). More specifically, as shown in FIG. 8C, the control unit 4 causes the main transport robot TR1 to unload a substrate W (first substrate W) from the fifth substrate holder 27*e*, and load the substrate W into one of the substrate processing units 12. Thereafter, the control unit 4 causes the main transport robot TR1 to unload a substrate W (second substrate W) from the fourth substrate holder 27*d*, and load the substrate W into another of the substrate processing units 12. Thus, the control unit 4 individually unloads the substrates W in a sequence from the one side defined with respect to the vertical direction D1.

Figure 8D:
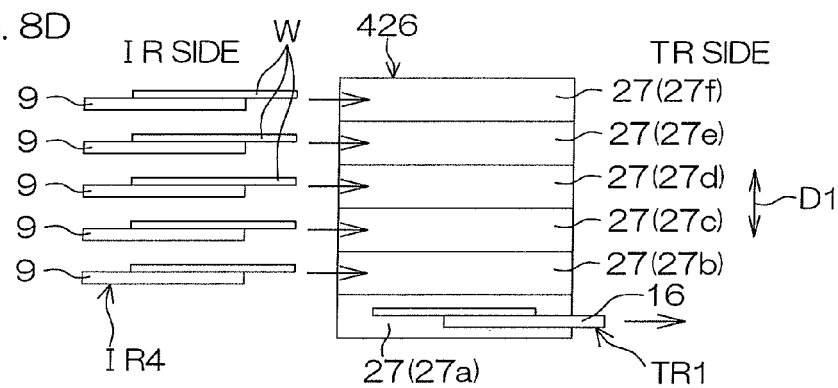

After the main transport robot TR1 unloads a substrate W (fourth substrate W) from the second substrate holder 27*b*, as shown in FIG. 8D, the upper five substrate holders 27 (the sixth substrate holder 27*f*, the fifth substrate holder 27*e*, the fourth substrate holder 27*d*, the third substrate holder 27*c* and the second substrate holder 27*b* in FIG. 8D) are empty. After the main transport robot TR1 unloads the fourth substrate W, as shown in FIG. 8D, the control unit 4 causes the indexer robot IR4 to simultaneously load five substrates W into five substrate holders 27 consecutively arranged vertically (D1) from the one side defined with respect to the vertical direction D1 (second loading step).

After the indexer robot IR4 simultaneously loads the five substrates W again and the main transport robot TR1 unloads a substrate W (fifth substrate W) from the first substrate holder 27*a*, the control unit 4 causes the rotation mechanism 28 to rotate the six substrate holders 27 180 degrees about the rotation axis L1 to invert the substrates W. Then, the control unit 4 causes the main transport robot TR1 to unload the substrates W from the second inversion unit 426 again. The control unit 4 repeatedly performs this operation sequence, whereby the plurality of substrates W are transported from the carrier C to the substrate processing units 12.

The loading of the five substrates W by the indexer robot IR4 after the unloading of the fourth substrate W by the main transport robot TR1 may precede or follow the unloading of the fifth substrate W by the main transport robot TR1. The loading of the five substrates W by the indexer robot IR4 may be concurrent with the unloading of the fifth substrate W by the main transport robot TR1.

Fifth Embodiment

FIGS. 9A, 9B, 9C and 9D are schematic diagrams for explaining an exemplary operation to be performed by an indexer robot IR5, a main transport robot TR1 and a second inversion unit 526 according to a fifth embodiment of the present invention to transport a plurality of substrates W from a carrier retaining unit 6 to substrate processing units 12 while causing the second inversion unit 526 to perform a substrate inverting operation. In FIGS. 9A, 9B, 9C and 9D, components corresponding to those shown in FIGS. 1 to 8D will be designated by the same reference characters as in FIGS. 1 to 8D, and duplicate description of these components will be omitted.

Major differences between the first embodiment and the fifth embodiment are the number of substrates W to be simultaneously transported by the indexer robot IR5, and the number of substrate holders 27 provided in the second inversion unit 526.

In the fifth embodiment, the number of the substrates W to be simultaneously transported by the indexer robot IR5 is four. As in the first embodiment, the control unit 4 causes the main transport robot TR1 to unload substrates W in a group of two from the second inversion unit 526. In the fifth embodiment, n is 4, and m is 2. Therefore, the number (n+m) of the substrate holders 27 provided in the second inversion unit 526 is six. That is, six substrate holders 27 (a first substrate holder 27*a*, a second substrate holder 27*b*, a third substrate holder 27c, a fourth substrate holder 27d, a fifth substrate holder 27e and a sixth substrate holder 27f) are provided in the second inversion unit 526.

An exemplary operation to be performed by the indexer robot IR5, the main transport robot TR1 and the second inversion unit 526 to transport a plurality of substrates W from the carrier retaining unit 6 to the substrate processing units 12 while causing the second inversion unit 526 to perform the substrate inverting operation will hereinafter be described specifically.

Figure 9A:
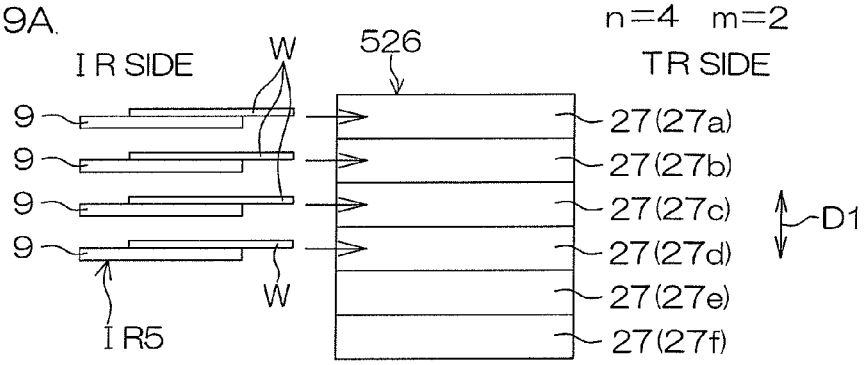
FIGS. 9A, 9B, 9C and 9D are schematic diagrams for explaining an exemplary operation to be performed by an indexer robot, a main transport robot and a second inversion unit according to a fifth embodiment of the present invention to transport a plurality of substrates from a carrier retaining unit to substrate processing units while causing the second inversion unit to perform a substrate inverting operation.

As shown in FIG. 9A, the control unit 4 causes the indexer robot IR5 to simultaneously transport four substrates W from one of the carriers C to the second inversion unit 526. Then, as shown in FIG. 9A, the control unit 4 causes the indexer robot IR5 to simultaneously load these four substrates W into four substrate holders 27 (the first substrate holder 27a, the second substrate holder 27b, the third substrate holder 27c and the fourth substrate holder 27d in FIG. 9A) consecutively arranged vertically (D1) from one of opposite sides defined with respect to the vertical direction D1 (first loading step).

Figure 9B:
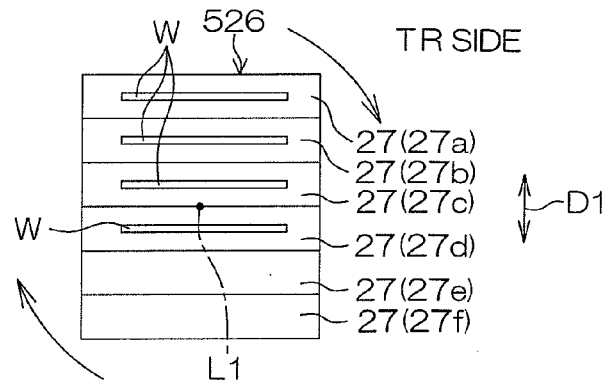
Figure 9C:
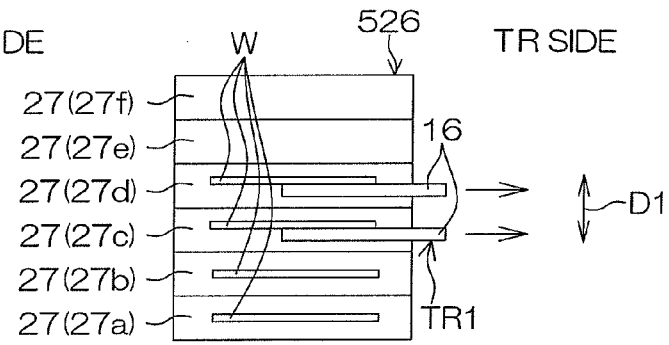

Thereafter, as shown in FIG. 9B, the control unit 4 causes the rotation mechanism 28 to rotate the six substrate holders 27 180 degrees about the rotation axis L1 to invert the substrates W. Thus, as shown in FIG. 9C, the six substrate holders 27 are arranged vertically (D1) in a post-rotation arrangement sequence reverse to a pre-rotation arrangement sequence in which the substrate holders 27 are arranged before the rotation. That is, the first substrate holder 27a, the second substrate holder 27b, the third substrate holder 27c, the fourth substrate holder 27d, the fifth substrate holder 27e and the sixth substrate holder 27f are previously arranged vertically (D1) in this sequence from the top and, after the rotation, the sixth substrate holder 27f, the fifth substrate holder 27e, the fourth substrate holder 27d, the third substrate holder 27c, the second substrate holder 27b and the first substrate holder 27a are arranged vertically (D1) in this sequence from the top.

After the six substrate holders 27 are rotated 180 degrees, the control unit 4 causes the main transport robot TR1 to unload the four substrates W from the four substrate holders 27, respectively, and then load these four substrates W into the substrate processing units 12 (unloading step). More specifically, as shown in FIG. 9C, the control unit 4 causes the main transport robot TR1 to simultaneously unload a substrate W (first substrate W) retained in the fourth substrate holder 27d and a substrate W (second substrate W) retained in the third substrate holder 27c, and respectively load these two substrates W into two of the substrate processing units 12. Thereafter, the control unit 4 causes the main transport robot TR1 to simultaneously unload a substrate W (third substrate W) retained in the second substrate holder 27b and a substrate W (fourth substrate W) retained in the first substrate holder 27a, and respectively load these two substrates W into other two of the substrate processing units 12. Thus, the control unit 4 unloads the substrates W in a group of two in a sequence from the one side defined with respect to the vertical direction D1.

Figure 9D:
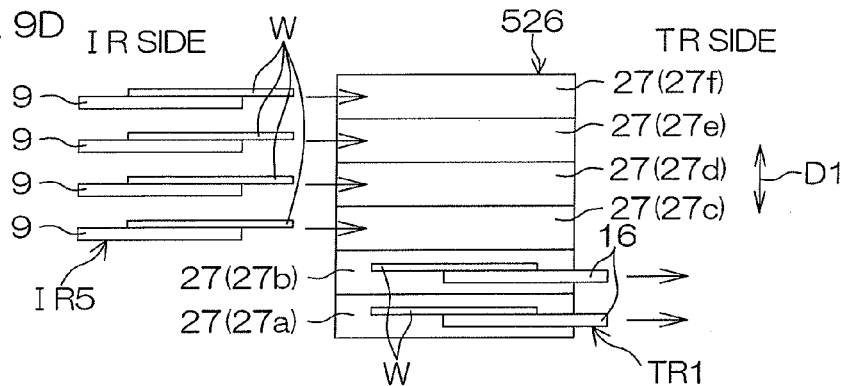

After the main transport robot TR1 unloads the two substrates W (first and second substrates W) from the fourth substrate holder 27d and the third substrate holder 27c, as shown in FIG. 9D, the upper four substrate holders 27 (the sixth substrate holder 27f, the fifth substrate holder 27e, the fourth substrate holder 27d and the third substrate holder 27c in FIG. 9D) are empty. After the main transport robot TR1 unloads the first and second substrates W, as shown in FIG. 9D, the control unit 4 causes the indexer robot IR5 to simultaneously load four substrates W into four substrate holders 27 consecutively arranged vertically (D1) from the one side defined with respect to the vertical direction D1 (second loading step).

After the indexer robot IR5 simultaneously loads the four substrates W again and the main transport robot TR1 unloads the two substrates W (third and fourth substrates W) from the second substrate holder 27b and the first substrate holder 27a, the control unit 4 causes the rotation mechanism 28 to rotate the six substrate holders 27 180 degrees about the rotation axis L1 to invert the substrates W. Then, the control unit 4 causes the main transport robot TR1 to unload the substrates W from the second inversion unit 526 again. The control unit 4 repeatedly performs this operation sequence, whereby the plurality of substrates W are transported from the carrier C to the substrate processing units 12.

The loading of the four substrates W by the indexer robot IR5 after the unloading of the first and second substrates W by the main transport robot TR1 may precede or follow the unloading of the third and fourth substrates W by the main transport robot TR1. The loading of the four substrates W by the indexer robot IR5 may be concurrent with the unloading of the third and fourth substrates W by the main transport robot TR1.

In the first to fifth embodiments, as described above, the control unit 4 empties the upper n substrate holders 27 before all the substrates W (n substrates W) previously loaded by the indexer robot IR1 to IR5 are unloaded. Therefore, the control unit can cause the indexer robot IR1 to IR5 to load n substrates W into the upper n substrate holders 27 before all the substrates W previously loaded by the index robot IR1 to IR5 are unloaded. Thus, there is no need to keep the indexer robot IR1 to IR5 in standby until all the substrates W previously loaded by the indexer robot IR1 to IR5 are unloaded. This reduces the standby period of the indexer robot IR1 to IR5. Further, the number of the substrate holders 27, which is n+m (wherein m is a positive integer smaller than n), is smaller than twice the number (n) of the substrates W to be simultaneously transported by the indexer robot IR1 (2n). This suppresses or prevents the size increase of the substrate processing apparatus 1 as compared with the case in which the number of the substrate holders 27 provided in the second inversion unit is twice the number of the substrates W to be simultaneously transported by the indexer robot IR1.

Other Embodiments

While the embodiments of the present invention have thus been described, it should be understood that the present invention be not limited to these embodiments, but various modifications may be made within the scope of the appended claims.

In the embodiments described above, the standby period of the indexer robot is reduced by transporting the plurality of substrates from the indexer robot side to the main transport robot side via the second inversion unit. Similarly to the case in which the plurality of substrates are transported from the indexer robot side to the main transport robot side via the second inversion unit, the plurality of substrates may be transported from the main transport robot side to the indexer robot side via the second inversion unit.

More specifically, the control unit 4 may cause the main transport robot to simultaneously transport n substrates W from the substrate processing units 12 to the second inversion unit and load the n substrates W into the second inversion unit. After the n substrates W are inverted by the second inversion unit, the control unit 4 may cause the indexer robot to unload the n substrates W in a group of m from the second inversion unit. This makes it possible to reduce the standby period of the main transport robot.

In the embodiments described above, the first inversion unit which is accessible only from the main transport robot side is provided above the second inversion unit. However, the first inversion unit may have the same construction as the second inversion unit, so that the first inversion unit is accessible from both the indexer robot side and the main transport robot side. In this case, one of these inversion units may be used for transporting a plurality of substrates from the indexer robot side to the main transport robot side, and the other inversion unit may be used for transporting a plurality of substrates from the main transport robot side to the indexer robot side.

In the embodiments described above, the substrate holders 27 are arranged in the vertical direction D1. Alternatively, the substrate holders 27 may be arranged in any other predetermined direction.

In the embodiments described above, the substrate holders 27 are each configured to hold a substrate W between the plates. Alternatively, the substrate holders 27 may be each configured to hold the substrate W by suction or other method.

In the embodiments described above, the substrate holders 27 have the same construction. Alternatively, plural types of substrate holders 27 having different structures may be provided in the second inversion unit.

In the embodiments described above, the control unit 4 causes the indexer robot to simultaneously load the n substrates into the n substrate holders 27, respectively, in both the first loading step and the second loading step. Alternatively, the control unit 4 may cause the indexer robot to separately load the n substrates W into the n substrate holders 27 at different times in at least one of the first loading step and the second loading step.

In the embodiments described above, the indexer robot IR1 respectively loads the substrates W into upper ones of the vertically (D1) arranged substrate holders 27 in both the first loading step and the second loading step. Alternatively, the control unit 4 may load the substrates W into lower ones of the vertically (D1) arranged substrate holders 27 in at least one of the first loading step and the second loading step.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2010-159708 filed in the Japanese Patent Office on Jul. 14, 2010, the disclosure of which is incorporated herein by reference in its entirety.

What is claimed is:

1. A substrate processing apparatus comprising:
   a first retaining unit and a second retaining unit which each retain substrates;
   n+m substrate holders (wherein n is an integer not smaller than 2 and m is a positive integer that is smaller than n and a divisor of n) capable of respectively retaining substrates in state where the substrates are arranged along a predetermined arrangement direction, the n+m substrate holders being unitarily rotatable for a substrate inverting operation;
   a rotation mechanism which rotates the n+m substrate holders so as to perform the substrate inverting operation and so as to arrange the n+m substrate holders along the arrangement direction in a post-rotation arrangement sequence reverse to a pre-rotation arrangement sequence in which the n+m substrate holders are arranged before rotation;
   a first transport robot which transports a substrate;
   a second transport robot which transports a substrate; and
   a control unit which performs: a first loading step of controlling the first transport robot so that n substrates are unloaded from the first retaining unit, then simultaneously transported and respectively loaded into n of the substrate holders consecutively arranged from one of opposite sides defined with respect to the arrangement direction by the first transport robot; an inverting step of controlling the rotation mechanism after the first loading step to rotate the n+m substrate holders so as to perform the substrate inverting operation and so as to arrange the n+m substrate holders along the arrangement direction in the post-rotation arrangement sequence reverse to the pre-rotation arrangement sequence; an unloading step of controlling the second transport robot after the inverting step so that the n substrates loaded into the n substrate holders in the first loading step are unloaded in a group of m in a sequence from the one side defined with respect to the arrangement direction and loaded into the second retaining unit by the second transport robot; and a second loading step of controlling the first transport robot after the inverting step so that n substrates are unloaded from the first retaining unit, then simultaneously transported and loaded into n of the substrate holders consecutively arranged from the one side defined with respect to the arrangement direction by the first transport robot.

2. The substrate processing apparatus according to claim 1, wherein the control unit performs the second loading step concurrently with the unloading step.

3. The substrate processing apparatus according to claim 1, wherein the control unit causes the first transport robot to simultaneously load the n substrates into the n substrate holders, respectively, in at least one of the first loading step and the second loading step.

4. The substrate processing apparatus according to claim 1, wherein n has a value that is equal to m multiplied by 2.

5. The substrate processing apparatus according to claim 1,
   wherein the first retaining unit includes a container retaining unit which retains a plurality of containers each capable of containing a plurality of substrates,
   wherein the second retaining unit includes a substrate processing unit which retains a substrate and processes the retained substrate,
   the substrate processing apparatus further comprising a movement mechanism which moves the first transport robot,
   wherein the control unit controls the movement mechanism to move the first transport robot between the containers and the substrate holders.

6. The substrate processing apparatus according to claim 1, further comprising a substrate transfer unit which retains a substrate,
   wherein the control unit further performs a transporting step of transporting a substrate between the first retaining unit and the second retaining unit with a front surface of the substrate facing in a predetermined direction, the transporting step including a first transporting step of causing the first transport robot to transport the substrate between the first retaining unit and the substrate transfer unit with the front surface of the substrate facing in the predetermined direction, and a second transporting step of causing the second transport robot to transport the substrate between the second retaining unit and the substrate transfer unit with the front surface of the substrate facing in the predetermined direction.

7. The substrate processing apparatus according to claim 1, wherein the first transport robot includes a first hand movable along the arrangement direction, and a first hand movement mechanism which moves the first hand along the arrangement direction,
wherein the second transport robot includes a second hand movable along the arrangement direction, and a second hand movement mechanism which moves the second hand along the arrangement direction,
wherein the control unit causes the first hand movement mechanism to move the first hand into opposed relation to the n+m substrate holders in at least one of the first loading step and the second loading step, and causes the second hand movement mechanism to move the second hand into opposed relation to the n+m substrate holders in the unloading step.

8. The substrate processing apparatus according to claim 1, wherein at least one of the first transport robot and the second transport robot is opposed to the n+m substrate holders in an opposing direction perpendicular to the arrangement direction,
wherein the n+m substrate holders are rotatable about a rotation axis perpendicular to the arrangement direction and the opposing direction,
wherein the control unit rotates the n+m substrate holders 180 degrees about the rotation axis in the inverting step.

9. A substrate transport method to be implemented by a substrate processing apparatus including a first retaining unit and a second retaining unit which each retain substrates, n+m substrate holders (wherein n is an integer not smaller than 2 and m is a positive integer that is smaller than n and a divisor of n) capable of respectively retaining substrates in state where the substrates are arranged along a predetermined arrangement direction, the n+m substrate holders unitarily rotatable for a substrate inverting operation, a rotation mechanism which rotates the n+m substrate holders so as to perform the substrate inverting operation and so as to arrange the n+m substrate holders along the arrangement direction in a post-rotation arrangement sequence reverse to a pre-rotation arrangement sequence in which the n+m substrate holders are arranged before rotation, a first transport robot which transports a substrate, and a second transport robot which transports a substrate, the substrate transport method comprising:
a first loading step of causing the first transport robot to unload n substrates from the first retaining unit, then simultaneously transport the n substrates, and respectively load then substrates into n of the substrate holders consecutively arranged from one of opposite sides defined with respect to the arrangement direction;
an inverting step of causing the rotation mechanism after the first loading step to rotate the n+m substrate holders so as to perform the substrate inverting operation and so as to arrange the n+m substrate holders along the arrangement direction in the post-rotation arrangement sequence reverse to the pre-rotation arrangement sequence;
an unloading step of causing the second transport robot after the inverting step to perform an m-substrate unloading operation such that the n substrates loaded into the n substrate holders in the first loading step are unloaded in a group of m in a sequence from the one side defined with respect to the arrangement direction and loaded into the second retaining unit by the second transport robot; and
a second loading step of causing the first transport robot after the inverting step to unload n substrates from the first retaining unit, then simultaneously transport the n substrates, and respectively load the n substrates into n of the substrate holders consecutively arranged from the one side defined with respect to the arrangement direction.

10. The substrate transport method according to claim 9, wherein the second loading step is performed concurrently with the unloading step.

11. The substrate transport method according to claim 9, wherein at least one of the first loading step and the second loading step includes a step of causing the first transport robot to simultaneously load the n substrates into the n substrate holders, respectively.

12. The substrate transport method according to claim 9, wherein n has a value that is equal to m multiplied by 2.

13. The substrate transport method according to claim 9,
wherein the first retaining unit includes a container retaining unit which retains a plurality of containers each capable of containing a plurality of substrates,
wherein the second retaining unit includes a substrate processing unit which retains a substrate and processes the retained substrate,
wherein the substrate processing apparatus further includes a movement mechanism which moves the first transport robot,
the substrate transport method further comprising a step of causing the movement mechanism to move the first transport robot between the containers and the substrate holders.

14. The substrate transport method according to claim 9, wherein the substrate processing apparatus further includes a substrate transfer unit,
the substrate transport method further comprising a transporting step of transporting a substrate between the first retaining unit and the second retaining unit with a front surface of the substrate facing in a predetermined direction, the transporting step including a first transporting step of causing the first transport robot to transport the substrate between the first retaining unit and the substrate transfer unit with the front surface of the substrate facing in the predetermined direction, and a second transporting step of causing the second transport robot to transport the substrate between the second retaining unit and the substrate transfer unit with the front surface of the substrate facing in the predetermined direction.

15. The substrate transport method according to claim 9,
wherein the first transport robot includes a first hand movable along the arrangement direction, and a first hand movement mechanism which moves the first hand along the arrangement direction,
wherein the second transport robot includes a second hand movable along the arrangement direction, and a second hand movement mechanism which moves the second hand along the arrangement direction,
wherein at least one of the first loading step and the second loading step includes a step of causing the first hand movement mechanism to move the first hand into opposed relation to the n+m substrate holders,
wherein the unloading step includes a step of causing the second hand movement mechanism to move the second hand into opposed relation to the n+m substrate holders.

16. The substrate transport method according to claim 9,
wherein at least one of the first transport robot and the second transport robot is opposed to the n+m substrate holders in an opposing direction perpendicular to the arrangement direction,
wherein the n+m substrate holders are rotatable about a rotation axis perpendicular to the arrangement direction and the opposing direction,
wherein the inverting step includes the step of causing the rotation mechanism to rotate the n+m substrate holders 180 degrees about the rotation axis.

* * * * *

UNITED STATES PATENT AND TRADEMARK OFFICE
CERTIFICATE OF CORRECTION

PATENT NO.       : 8,744,614 B2                                  Page 1 of 1
APPLICATION NO.  : 13/183077
DATED            : June 3, 2014
INVENTOR(S)      : Eisaku Machida It is certified that error appears in the above-identified patent and that said Letters Patent is hereby corrected as shown below:

In the Claims

Claim 9 at column 31, line 53, "then" should read --the n--

Signed and Sealed this
Fourteenth Day of April, 2015

Michelle K. Lee
*Director of the United States Patent and Trademark Office*